US012231123B2

(12) United States Patent
Rylov et al.

(10) Patent No.: US 12,231,123 B2
(45) Date of Patent: Feb. 18, 2025

(54) METASTABILITY-FREE CLOCKLESS SINGLE FLUX QUANTUM LOGIC CIRCUITRY

(71) Applicant: International Business Machines Corporation, Armonk, NY (US)

(72) Inventors: Sergey Rylov, White Plains, NY (US); John Francis Bulzacchelli, Somers, NY (US); Matthew Beck, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 224 days.

(21) Appl. No.: 17/971,700

(22) Filed: Oct. 24, 2022

(65) Prior Publication Data

US 2024/0137027 A1 Apr. 25, 2024
US 2024/0235558 A9 Jul. 11, 2024

(51) Int. Cl.
*H03K 19/195* (2006.01)
*G06F 1/10* (2006.01)
(Continued)

(52) U.S. Cl.
CPC .......... *H03K 19/195* (2013.01); *G06F 1/10* (2013.01); *G06N 10/20* (2022.01); *G06N 10/40* (2022.01);
(Continued)

(58) Field of Classification Search
CPC ...... H03K 17/92; H03K 19/1952; H03K 3/38; H03K 19/195; H03K 19/20; H03K 19/1954; G06F 1/10; G06N 10/40; G06N 10/20
(Continued)

(56) References Cited

U.S. PATENT DOCUMENTS 10,680,617 B2  6/2020  Rylov
11,115,027 B2  9/2021  Rylov
2018/0226974 A1*  8/2018  Harms .................. G06N 10/00

FOREIGN PATENT DOCUMENTS

WO  PCT/IB2023/058312  12/2023

OTHER PUBLICATIONS

B. Dimov et al., "Universal Asynchronous RSFQ Gate for Realization of Boolean Functions of Dual-Rail Binary Variables," Journal of Physics Conference Series, Jun. 1, 2006, pp. 1183-1186, vol. 43, No. 1.
(Continued)

*Primary Examiner* — Arnold M Kinkead
(74) *Attorney, Agent, or Firm* — Erik Johnson; Ryan, Mason & Lewis, LLP

(57) ABSTRACT

A device includes a logic circuit comprising a clockless single flux quantum logic gate which comprises a plurality of input ports, an output port, an output Josephson junction, and a plurality of dynamic storage loop circuits and isolation buffer circuits. The output Josephson junction is coupled to an output of each dynamic storage loop circuit and configured to drive the output port. Each isolation buffer circuit is coupled to a respective input port, and a respective dynamic storage loop circuit and configured to absorb a circulating current of an antifluxon which is injected into the respective dynamic storage loop circuit to prevent the antifluxon from being output from the respective input port, and to inject a fluxon into the respective dynamic storage loop circuit in response to a single flux quantum pulse applied to the respective input port, and annihilate an antifluxon present in the respective dynamic storage loop circuit.

20 Claims, 10 Drawing Sheets

(51) Int. Cl.
  *G06N 10/20*    (2022.01)
  *G06N 10/40*    (2022.01)
  *H03K 19/20*    (2006.01)

(52) U.S. Cl.
  CPC ......... *H03K 19/1954* (2013.01); *H03K 19/20* (2013.01)

(58) Field of Classification Search
  USPC .............................................. 327/367; 326/3
  See application file for complete search history.

(56) References Cited

OTHER PUBLICATIONS

S. V. Rylov, "Clockless Dynamic SFQ and Gate With High Input Skew Tolerance," IEEE Transactions on Applied Superconductivity, vol. 29, No. 5, Aug. 2019, 5 pages.

K. K. Likharev et al., "RSFQ Logic/Memory Family: A New Josephson-Junction Technology for Sub-Terahertz-Clock-Frequency Digital Systems," IEEE Transactions on Applied Superconductivity, vol. 1, No. 1, Mar. 1991, 26 pages.

G. Tzimpragos et al., "Superconducting Computing with Alternating Logic Elements," 48th Annual International Symposium on Computer Architecture, Jun. 2021, pp. 651-664.

G. Krylov et al., "Asynchronous Dynamic Single-Flux Quantum Majority Gates," IEEE Transactions on Applied Superconductivity, vol. 30, No. 5, Aug. 2020, 7 pages.

* cited by examiner

500

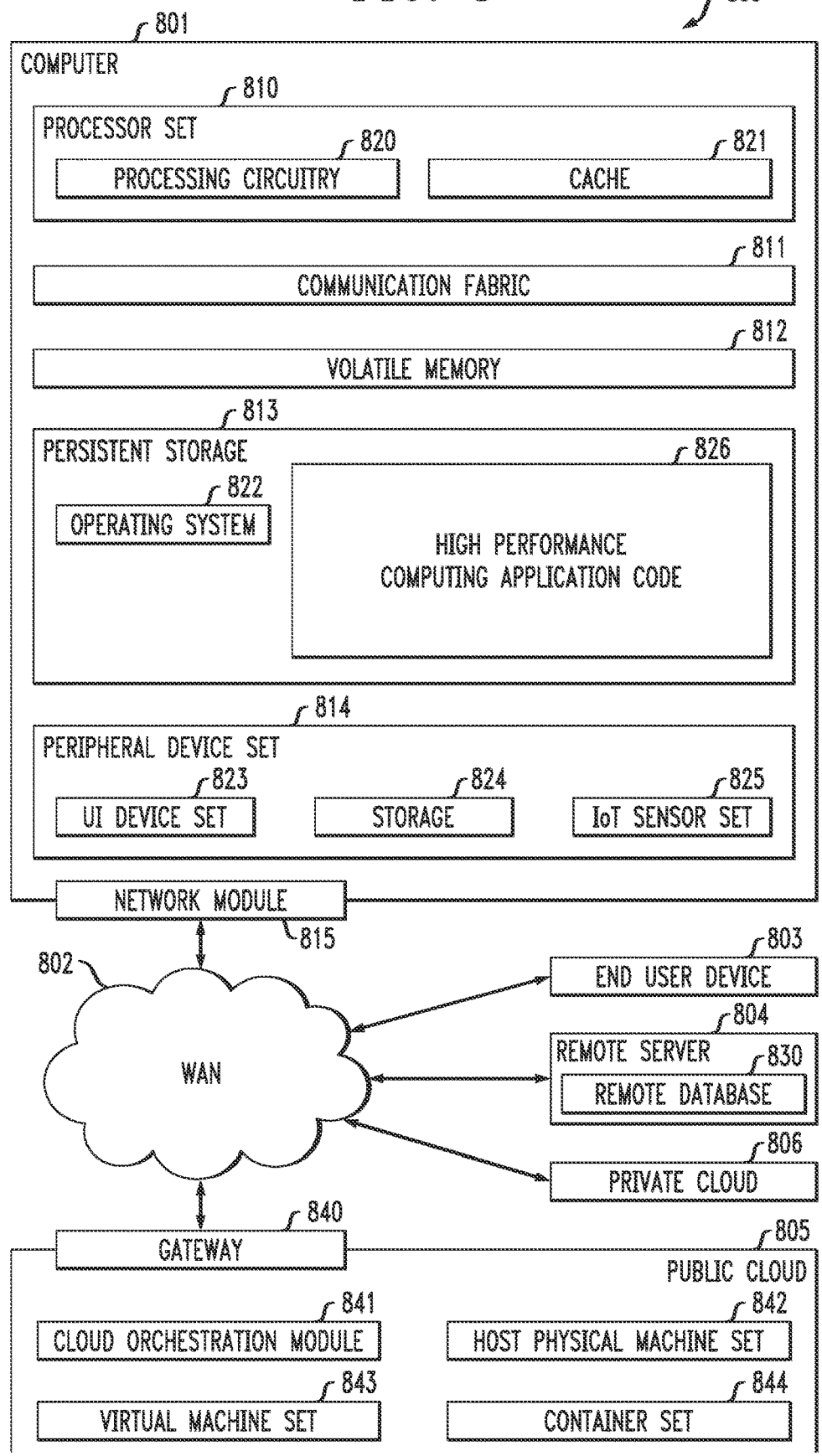

METASTABILITY-FREE CLOCKLESS SINGLE FLUX QUANTUM LOGIC CIRCUITRY

STATEMENT REGARDING FEDERALLY SPONSORED RESEARCH OR DEVELOPMENT

This invention was made with government support under 2019-19051000001 Intelligence Advanced Research Projects Activity (IARPA). The government has certain rights to this invention.

BACKGROUND

This disclosure relates generally to superconducting logic circuits and systems and, in particular, to superconducting clockless single flux quantum (SFQ) logic circuitry such as superconducting clockless dynamic single flux quantum (DSFQ) logic circuitry. In general, superconducting logic circuits comprise logic gates that are designed based on, e.g., superconducting passive elements (e.g., superconducting inductors, superconducting transmission lines, etc.), Josephson junctions (which are configured to operate as ultrafast Josephson junction switches), and quantization of magnetic flux. For superconducting computing, the superconducting electronic circuits are configured to operate at cryogenic temperatures (e.g., below 10 Kelvin).

Superconducting logic circuits can be implemented using different types of SFQ logic architectures which utilize SFQ pulses (also referred to as magnetic single flux quantum pulses) to encode, process, and transmit data. An SFQ pulse is a voltage pulse whose time integral is equal to a discrete amount of magnetic flux, i.e., a single magnetic flux quantum, referred to herein as a "fluxon." For superconducting applications, SFQ logic is utilized as an alternative to conventional complementary metal-oxide-semiconductor (CMOS) circuitry for high performance computing (HPC) applications due to the higher operating speed and low power consumption achieved through the use of superconducting SFQ circuitry as compared to conventional room temperature CMOS circuitry. In addition, superconducting SFQ circuitry can be readily fabricated using state-of-the-art thin-film very-large-scale integration ("VLSI") lithographic fabrication techniques.

Current state-of-the-art SFQ logic architectures include, for example, direct current (DC)-powered SFQ logic families, such as rapid single flux quantum (RSFQ) logic and energy-efficient rapid single flux quantum (ERSFQ) logic, which operate intrinsically as state machines, wherein the SFQ logic gates have internal logic states which require a clock signal to reset the internal logic states to a ground state after each clock cycle. The use of clock signals in SFQ logic networks creates significant challenges for VLSI SFQ digital design, in particular, the use of a register transfer level (RTL) design paradigm, which is a cornerstone of VLSI digital design methodology. The RTL VLSI design paradigm is based on dividing large digital circuits into clock-free, state-free logic networks of significant depth called combinational logic clouds, wherein the system clocking is achieved using clocked registers at the boundaries of the combinational logic clouds to hold all system states.

On the other hand, more recent state-of-the-art SFQ logic architectures include, for example, DC-powered clockless DSFQ logic circuitry that comprises logic gates which operate asynchronously (without clocking) and which are configured with self-resetting circuitry to enable self-resetting of the internal states of the logic gate to ground state without the use of clock signals. In this regard, DSFQ is highly compatible with RTL VLSI design methodology which, as noted above, is based on use of deep clouds of combinational (clockless) logic separated by clocked register boundaries.

One problem associated with SFQ logic circuitry, either clocked SFQ logic circuitry or clockless SFQ logic circuitry, is that in some SFQ logic gates there is a small but finite probability that a given logic gate can enter into a metastable state due to, e.g., two input SFQ pulses being applied to input ports of the SFQ logic gate with a specific skew (e.g., a small skew of a few SFQ pulse widths or less). The metastable state of a given SFQ logic gate, which is generated in a given clock cycle of a VLSI network of logic gates that is controlled with clocked register boundaries, can result in erroneous data being generated in a next clock cycle of the VLSI logic network, which leads to errors.

SUMMARY

Exemplary embodiments of the disclosure include superconducting clockless SFQ logic gates that are configured to prevent the possibility of entering into metastable states, e.g., metastable states caused by relatively small skews between input SFQ pulses.

For example, an exemplary embodiment includes a device which comprises a logic circuit comprising a clockless single flux quantum logic gate. The clockless single flux quantum logic gate comprises a plurality of input ports, an output port, a plurality of dynamic storage loop circuits, an output Josephson junction, and a plurality of isolation buffer circuits. The output Josephson junction is coupled to an output of each of the dynamic storage loop circuits and configured to drive the output port. Each isolation buffer circuit is coupled to a respective input port, and a respective dynamic storage loop circuit. Each isolation buffer circuit is configured to absorb a circulating current of an antifluxon which is injected into the respective dynamic storage loop circuit as a result of the output Josephson junction switching to generate a single flux quantum output pulse on the output port, in order to prevent the antifluxon from being output from the respective input port. Each isolation buffer circuit is configured to inject a fluxon into the respective dynamic storage loop circuit in response to a single flux quantum pulse applied to the respective input port, and annihilate an antifluxon that is present in the respective dynamic storage loop circuit.

Advantageously, the use of an antifluxon that is present in a given dynamic storage loop circuit to annihilate a fluxon that is subsequently injected into the given dynamic storage loop circuit prevents the clockless SFQ logic gate from entering into a metastable state as a result of a skewed pair of input SFQ pulses (e.g., a first (early) input SFQ pulse and a second (late) input SFQ pulse) being applied to different input ports of the clockless SFQ logic gate in the same clock cycle wherein the skewed input SFQ pulses are separated by delay of a few SFQ pulse widths or less. In addition, the isolation buffer circuits are configured to prevent backpropagating antifluxons in the dynamic storage loop circuits from being output from the input ports of the clockless SFQ logic gate, while allowing fluxons that are generated by late input SFQ pulses to be injected into the dynamic storage loop circuits and annihilated by antifluxons that may be present in the dynamic storage loop circuits.

In an exemplary embodiment, the clockless single flux quantum logic gate comprises a clockless logic OR gate comprising at least two input ports. In another exemplary embodiment, the clockless single flux quantum logic gate comprises a clockless logic majority gate comprising at least three input ports.

In another exemplary embodiment, as may be combined with the preceding paragraphs, the isolation buffer circuits have a same circuit architecture, and each of the isolation buffer circuits comprises a multi-stage Josephson transmission line buffer circuit.

In another exemplary embodiment, as may be combined with the preceding paragraphs, each multi-stage Josephson transmission line buffer circuit comprises an output stage which is coupled to an input of the respective dynamic storage loop circuit. The output stage comprises a Josephson junction that is biased at a level which allows the Josephson junction of the output stage to absorb a backpropagating antifluxon current which flows out from the input of the respective dynamic storage loop circuit, without switching the Josephson junction of the output stage as a result of a combination of the backpropagating antifluxon current and a static bias current which biases the Josephson junction of the output stage. In an exemplary embodiment, the Josephson junction of the output stage is biased at a level in which a magnitude of the static bias current is in a range of about 20 percent to about 40 percent of a critical current of the Josephson junction of the output stage.

Another exemplary embodiment includes a device which comprises a logic circuit comprising a clockless single flux quantum logic gate. The clockless single flux quantum logic gate comprises a first input port, a second input port, an output port, a first dynamic storage loop circuit, a second dynamic storage loop circuit, an output Josephson junction which is coupled to an output of the first dynamic storage loop circuit and an output of the second dynamic storage loop circuit, and which is configured to drive the output port, a first multi-stage Josephson transmission line buffer circuit coupled between the first input port and the first dynamic storage loop circuit, and a second multi-stage Josephson transmission line buffer circuit coupled between the second input port and the second dynamic storage loop circuit. The first multi-stage Josephson transmission line buffer circuit comprises an output stage which comprises a Josephson junction that is configured to absorb a circulating current of an antifluxon which is injected into the first dynamic storage loop circuit as a result of the output Josephson junction switching to generate a single flux quantum output pulse on the output port, in order to prevent the antifluxon from being output from the first input port, and configured to switch and inject a fluxon into the first dynamic storage loop circuit in response to a single flux quantum pulse applied to the first input port, and annihilate an antifluxon that is present in the first dynamic storage loop circuit. The second multi-stage Josephson transmission line buffer circuit comprises an output stage which comprises a Josephson junction that is configured to absorb a circulating current of an antifluxon which is injected into the second dynamic storage loop circuit as a result of the output Josephson junction switching to generate a single flux quantum output pulse on the output port, in order to prevent the antifluxon from being output from the second input port, and configured to switch and inject a fluxon into the second dynamic storage loop circuit in response to a single flux quantum pulse applied to the second input port, and annihilate an antifluxon that is present in the second dynamic storage loop circuit.

In another exemplary embodiment, as may be combined with the preceding paragraphs, the dynamic storage loop circuits have a same circuit architecture. The dynamic storage loop circuits each comprise a series combination of a superconducting inductor and a dynamic switch circuit, coupled to an input port and to the output port. The dynamic switch circuit comprises a parallel combination of a first Josephson junction, and a series combination of a second Josephson junction and a resistor. The dynamic switch circuit is configured to enable dynamic self-resetting of an internal state of the dynamic storage loop circuit based on a first time constant for temporarily storing magnetic flux of a fluxon or antifluxon, and a second time constant for ejecting the stored magnetic flux.

Another exemplary embodiment includes a method which comprises: receiving a first single flux quantum pulse on a first input port of a clockless single flux quantum logic gate in a given clock cycle; injecting a fluxon into a first dynamic storage loop circuit of the clockless single flux quantum logic gate in response to the first single flux quantum pulse; outputting a single flux quantum pulse on an output port of the clockless single flux quantum logic gate in response to the fluxon being injected into the first dynamic storage loop circuit; injecting an antifluxon into a second dynamic storage loop circuit of the clockless single flux quantum logic gate in response to outputting the single flux quantum pulse on the output port; and utilizing an isolation buffer circuit coupled to an input of the second dynamic storage loop circuit to absorb a circulating current of the antifluxon in the second dynamic storage loop circuit and prevent the antifluxon from being output from a second input port of the clockless single flux quantum logic gate.

In another exemplary embodiment, the method comprises receiving a second single flux quantum pulse on the second input port of the clockless single flux quantum logic gate in the given clock cycle, and utilizing the antifluxon in the second dynamic storage loop circuit to annihilate a fluxon that is injected into the second dynamic storage loop circuit in response to the second single flux quantum pulse so that the fluxon injected into the second dynamic storage loop circuit does not propagate to the output port.

Other embodiments will be described in the following detailed description of exemplary embodiments, which is to be read in conjunction with the accompanying figures.

BRIEF DESCRIPTION OF THE DRAWINGS

FIG. 8 schematically illustrates an exemplary architecture of a computing environment for hosting a superconducting computing platform, according to an exemplary embodiment of the disclosure.

DETAILED DESCRIPTION

Figure 1:
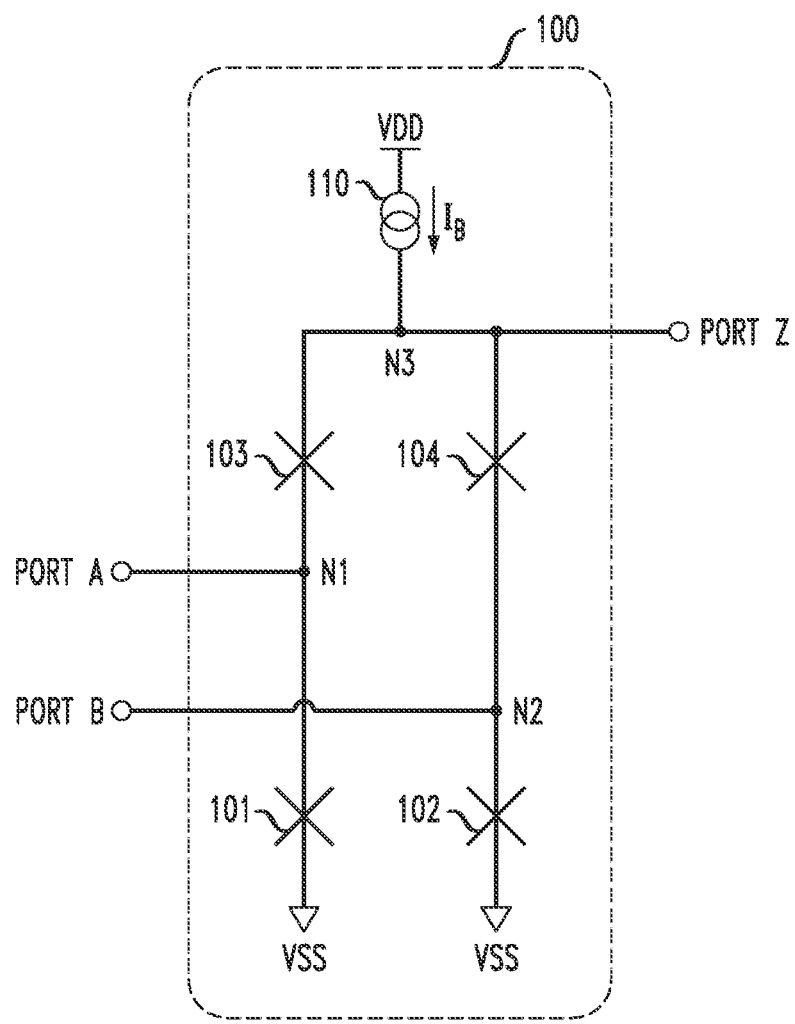
FIG. 1 schematically illustrates an exemplary embodiment of a confluence buffer circuit which is commonly utilized to implement an SFQ logic gate and which can cause the SFQ logic gate to enter into a metastable state.

Exemplary embodiments of the disclosure will now be described in further detail with regard to superconducting clockless (asynchronous) SFQ logic circuits comprising SFQ logic gates, such as SFQ logic OR gates, that are configured to prevent the possibility of entering into metastable states. It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise superconducting circuit elements (e.g., Josephson junctions), discrete circuit elements (e.g., transistors, inverters, etc.), programmable elements (e.g., application specific integrated circuit (ASIC) chips, field-programmable gate array (FPGA) chips, etc.), processing devices (e.g., central processing units (CPUs), graphics processing units (GPUs), etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

As noted above, for superconducting computing applications (e.g., exascale computing, or quantum computing, etc.), state-of-the-art superconducting integrated circuit (IC) fabrication techniques can be readily utilized to produce VLSI-level superconducting digital circuitry, particularly SFQ logic circuitry, which utilizes SFQ pulses to encode, process, and transmit data. Superconducting SFQ logic circuitry is particularly useful for HPC applications due to the high-speed operation (GHz) speeds and low switching energy (sub-femtojoule (fJ) provided by the SFQ logic circuitry when operating in cryogenic temperatures (e.g., 4K). In particular, clockless SFQ logic circuitry (e.g., DSFQ logic circuitry) is highly desirable due to its compatibility with CMOS VLSI RTL design methodology, since clockless SFQ logic is based on the use of deep clouds of clockless combinational logic separated by clocked register boundaries.

In a VLSI logic circuit, a large number of clockless SFQ logic gates can be utilized to implement combinational logic clouds, wherein data is fed into a given combinational logic cloud (in a given clock cycle) using a set of clocked registers at an input of the given combinational logic cloud which are controlled by a system clock, and output data generated by the given combinational logic cloud is captured by a set of clocked registers at the output of the given combinational logic cloud (in a next clock cycle). The captured data is then released to the next combinational logic cloud in a next clock cycle. In this configuration, a system clock controls the clock cycles for inputting data to a given combinational logic cloud and capturing data generated and output from the given combinational logic cloud.

With regard to timing closure, it is necessary for all operations that occur in a given combinational logic cloud within a given clock cycle to complete and settle before the next clock cycle in which the output data of the given combinational logic cloud is captured by the clocked registers at the output of the given combinational logic cloud. However, if a given logic gate within the given combinational logic cloud enters into a metastable state in a given clock cycle, the given logic gate may not settle to the desired stable state until a next clock cycle. In this regard, the erroneous data which is generated in the given clock cycle as a result of the metastable state, or which is generated in a next clock cycle after the metastable state settles to a stable state, causes undefined and inconsistent behavior of the logic circuit, which leads to errors.

As noted above, one problem associated with SFQ logic circuitry, either clocked SFQ logic circuitry or clockless SFQ logic circuitry, is that in some SFQ logic gates there is a small but finite probability that a given logic gate can enter into a metastable state. In general, metastability develops in any logic circuit that undergoes different sequences of switching events for different input skews and can cause extremely large delays in the logic gate returning to its ground state when the input skew of a logic gate is placed exactly on the boundary between the two modes of operation. For example, some SFQ logic gate circuits, particularly those related to OR logic function, employ a confluence buffer circuit which can cause the SFQ logic gate to enter into metastable states due to, e.g., two input SFQ pulses being applied to input ports of the SFQ logic gate with a specific skew (e.g., a small skew of about one SFQ pulse width which is normally a few picoseconds).

FIG. 1 schematically illustrates an exemplary embodiment of a confluence buffer circuit 100 which is commonly utilized to implement an SFQ logic gate and which can cause the SFQ logic gate to enter into a metastable state. The confluence buffer circuit 100 comprises first and second input ports (denoted Port A and Port B, respectively), an output port (denoted Port Z), a first input node N1 which is coupled to Port A, a second input node N2 which is coupled to Port B, a node N3 which is coupled to Port Z, a bridge of four Josephson junctions 101, 102, 103, and 104, and a DC bias circuit 110 which is coupled to the node N3 and configured to inject a bias current $I_B$ into the node N3.

The Josephson junctions 101 and 103 are serially connected between the output node N3 and a negative supply voltage node (denoted VSS). The Josephson junctions 102 and 104 are serially connected between the output node N3 and the negative supply voltage node VSS. In some embodiments, to provide symmetric input ports, the Josephson junctions 101 and 102 are configured to have the same critical current, and the Josephson junctions 103 and 104 are configured to have the same critical current, wherein the critical current (e.g., 100 microamps) of the Josephson junctions 103 and 104 is less than the critical current (e.g., 130 microamps) of the Josephson junctions 101 and 102. The DC bias circuit 110 is configured to generate a static DC bias current $I_B$ to provide static bias currents to bias the Josephson junctions 101, 102, 103, and 104 of the confluence buffer circuit 100. The Josephson junctions 101, 102, 103, and 104 are biased with static DC currents that are less than the critical currents of the Josephson junctions. While the DC bias circuit 110 is generically depicted in FIG. 1, the DC bias circuit 110 can be implemented using an RSFQ bias circuit or an ERSFQ bias circuit comprising a limiter Josephson junction connected in series with a large superconducting inductor, as is known in the art.

The confluence buffer circuit 100 operates as follows. Assume that a first SFQ pulse is input to Port A. The first input SFQ pulse is applied to node N1, which causes the current flow through the Josephson junction 101 to exceed its critical current and thus causes the Josephson junction 101 to switch. In this case, the Josephson junction 103 does not switch (and remains in a superconducting state) and then after a delay of about one pulse width, e.g., a few picoseconds, the Josephson junction 104 switches and an output SFQ pulse is generated at the node N3 and output from Port Z. The switching of the Josephson junction 104 prevents the output SFQ pulse from reaching the input Port B.

Assume further that a second SFQ pulse is input to Port B at some time delay of several pulse widths (following the first input SFQ pulse applied to Port A). The second input SFQ pulse is applied to node N2, which causes the current flow through the Josephson junction 102 to exceed its critical current and thus causes the Josephson junction 102 to switch. In this case, the Josephson junction 104 does not switch (and remains in a superconducting state) and then after a delay of about one SFQ pulse width, e.g., a few picoseconds, the Josephson junction 103 switches and an output SFQ pulse is generated at the node N3 and output from Port Z. The switching of the Josephson junction 103 prevents the output SFQ pulse from reaching the input Port A. In this circumstance, a pair of sufficiently skewed (mutually delayed) input SFQ pulses to Port A and Port B yields two output SFQ pulses on output port Z.

On the other hand, if the skew (time delay) between the first and second input SFQ pulses applied to the respective Ports A and B is small (e.g., less than one pulse width), the confluence buffer circuit 100 operates differently. In particular, if the first and second input SFQ pulses are applied to the respective input ports Port A and Port B with such small time delay, the Josephson junctions 101 and 102, and the output Port Z switch once, while the Josephson junctions 103 and 104 do not switch. In this regard, the existence of these two distinct modes—(i) two output pulses resulting from two sufficiently skewed input pulses, and (ii) one output pulse resulting from two insufficiently skewed input pulses—leads to a metastable state on the boundary between these two distinct modes of operation that occurs for a very common input skew of a few picoseconds (about one SFQ pulse width), when the second pulse is emitted to port Z with a logarithmically diverging delay so it may be erroneously placed in the next system clock cycle and cause a digital error.

While a confluence buffer circuit such as shown in FIG. 1 is commonly used to implement certain types of SFQ logic gates, such as two-input SFQ logic OR gates, as noted above, the confluence buffer circuit 100 is generally unsuitable for VLSI logic design as it can cause an SFQ logic OR gate to enter into a metastable state when first and second input SFQ pulses having a skew close to one pulse width (which is a very common scenario) are applied to first and second input ports of the SFQ logic OR gate. A brute-force solution is to allow only ultra-low skewed SFQ pulses to be applied to the input ports, by utilizing clocked registers which precede the input to the SFQ logic OR gate. However, this solution is inapplicable to clockless SFQ logic. Exemplary embodiments of metastability-free clockless SFQ logic gates will now be discussed in further detail in conjunction with, e.g., FIGS. 2, 3A, 3B, 4A-4C, 5, and 6.

Figure 2:
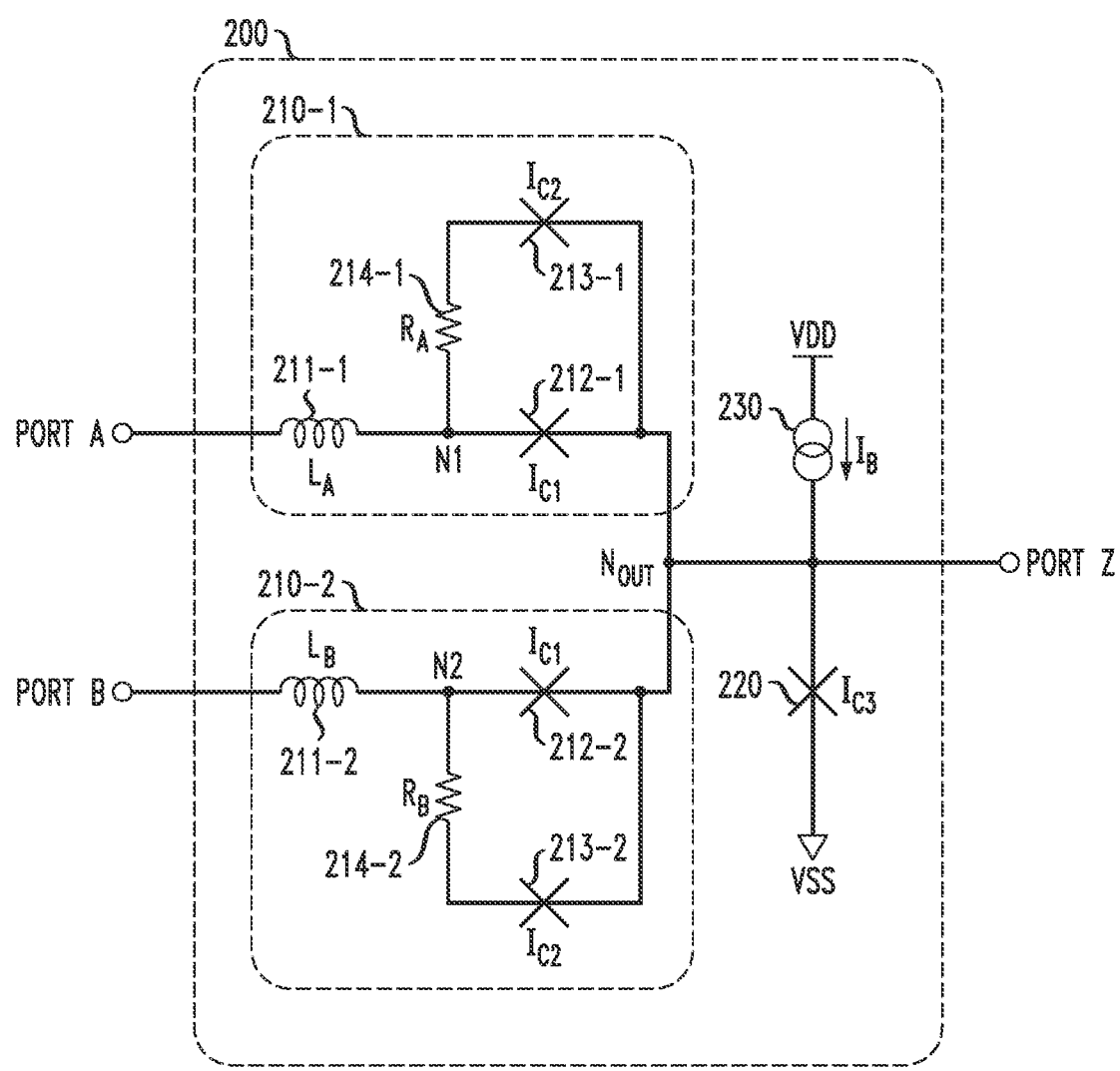
FIG. 2 schematically illustrates a clockless SFQ logic OR gate, according to an exemplary embodiment of the disclosure.

For example, FIG. 2 schematically illustrates a clockless SFQ logic OR gate, according to an exemplary embodiment of the disclosure. In particular, FIG. 2 schematically illustrates a clockless DSFQ logic OR gate 200 which comprises a first input port (Port A), a second input port (Port B), an output port (Port Z), a first dynamic storage loop circuit 210-1, a second dynamic storage loop circuit 210-2, an output Josephson junction 220, and a DC bias circuit 230. As explained in further detail below, FIG. 2 schematically illustrates a two-input clockless DSFQ logic OR gate 200, which is configured to prevent the possibility of entering into a metastable state when first and second input SFQ pulses with a skew close to one pulse width are applied to first and second input ports, Port A and Port B, of the clockless DSFQ logic OR gate 200.

The first dynamic storage loop circuit 210-1 comprises a superconducting storage inductor 211-1 (e.g., a quantizing superconducting inductor), coupled in series with a first dynamic switch circuit, wherein the first dynamic switch circuit comprises a first Josephson junction 212-1, a second Josephson junction 213-1, and a resistor 214-1. The first Josephson junction 212-1 is connected in a first branch between a first node N1 and an output node $N_{OUT}$. The second Josephson junction 213-1 and the resistor 214-1 are serially connected in a second branch between the first node N1 and the output node $N_{OUT}$. In this configuration, the first branch is connected in parallel with the second branch to provide a nonlinear magnetic flux leakage mechanism that enables the first dynamic storage loop circuit 210-1 to have two independent time constants including (i) a first time constant corresponding to a dynamic hold time for temporarily storing a fluxon (or temporarily storing an antifluxon), and (ii) a second time constant corresponding to a self-resetting time in which the stored fluxon (or the stored antifluxon) is removed (ejected) from the first dynamic storage loop circuit 210-1 to reset the first dynamic storage loop circuit 210-1 to a ground state.

Similarly, the second dynamic storage loop circuit 210-2 comprises a superconducting storage inductor 211-2 (e.g., a quantizing superconducting inductor), coupled in series with a second dynamic switch circuit, wherein the second dynamic switch circuit comprises a first Josephson junction 212-2, a second Josephson junction 213-2, and a resistor 214-2. The first Josephson junction 212-2 is connected in a first branch between a second node N2 and the output node $N_{OUT}$. The second Josephson junction 213-2 and the resistor 214-2 are serially connected in a second branch between the second node N2 and the output node $N_{OUT}$. In this configuration, the first branch is connected in parallel with the second branch to provide a nonlinear magnetic flux leakage mechanism that enables the second dynamic storage loop circuit 210-2 to have two independent time constants including (i) a first time constant corresponding to a dynamic hold time for temporarily storing a fluxon (or temporarily storing an antifluxon), and (ii) a second time constant corresponding to a self-resetting time in which the stored fluxon (or the stored antifluxon) is removed (ejected) from the second dynamic storage loop circuit 210-2 to reset the second dynamic storage loop circuit 210-2 to a ground state.

In some embodiments, the SFQ logic OR gate 200 is implemented in a symmetric fashion, i.e., the first and second dynamic storage loop circuits 210-1 and 210-2 have the same or substantially the same circuit architecture. In particular, the superconducting storage inductor 211-1 comprises an inductance $L_A$, and the superconducting storage inductor 211-2 comprises an inductance $L_B$, wherein $L_A$ and $L_B$ are substantially the same. In some embodiments, $L_A$ and $L_B$ are on the order of 10 picoHenries (e.g., 13 pH). In addition, the first Josephson junctions 212-1 and 212-2 each have a critical current $I_{C1}$, and the second Josephson junctions 213-1 and 213-2 each have a critical current $I_{C2}$. In some embodiments, $I_{C1}$ and $I_{C2}$ are substantially the same. In other embodiments, the critical current $I_{C1}$ is greater than the critical current $I_{C2}$. For example, in some embodiments, $I_{C1}$ is 70 microamps (µA), and $I_{C2}$ is 50 µA. In addition, the resistor 214-1 has a resistance $R_A$, and the resistor 214-2 has a resistance $R_B$, wherein $R_A$ and $R_B$ are substantially the same. For example, in some embodiments, $R_A$ and $R_B$ are 1 Ohm, or less.

As schematically illustrated in FIG. 2, the first and second dynamic storage loop circuits 210-1 and 210-2 have outputs that are commonly connected to the output node $N_{OUT}$. The output Josephson junction 220 is coupled to and between the output node $N_{OUT}$ and a negative supply voltage node VSS. The output Josephson junction 220 is configured to have a critical current $I_{C3}$. The output Josephson junction 220 is configured to drive the output port, Port Z, which is coupled to the output node $N_{OUT}$. The DC bias circuit 230 is coupled between a positive power supply node VDD and the output node $N_{OUT}$. The DC bias circuit 230 is configured to generate a static bias current $I_B$ to bias the output Josephson junction 220. In some embodiments, the DC bias circuit 230 comprises an RSFQ or ERSFQ bias current source.

In some embodiments, to implement logic OR functionality, the magnitude of the bias current $I_B$ is selected to bias the output Josephson junction 220 higher than a typical value of about 70-75% of its critical current to allow the output Josephson junction 220 to switch, i.e., produce an SFQ pulse in response a circulating current of a single fluxon that is injected into either (i) the first dynamic storage loop circuit 210-1 in response to an input SFQ pulse applied to Port A or (ii) the second dynamic storage loop circuit 210-2 in response to an input SFQ pulse applied to Port B, and thereby apply an output SFQ pulse to Port Z. In some embodiments, to achieve this higher bias level for the output Josephson junction 220, the DC bias circuit 230 is configured to generate a static bias current $I_B$ with a magnitude that is a least 75% (or greater) of the critical current $I_{C3}$ of the output Josephson junction 220. For example, in an exemplary non-limiting embodiment, assuming the output Josephson junction 220 has a critical current $I_{C3}$=140 µA, the DC bias circuit 230 can be configured to generate a static bias current $I_B$=120 µA (e.g., providing a bias level of about 85%).

As is known in the art, the critical current (generally denoted $I_c$) of a Josephson junction denotes a maximum amount of current that can coherently flow through the Josephson junction, while exhibiting no resistive dissipation. In particular, a Josephson junction operates as a non-linear superconducting inductor when the amount of superconducting current flowing through the Josephson junction is less than the critical current. However, when the current flow through the Josephson junction exceeds its critical current, the Josephson junction temporarily transitions to a resistive state, which causes a finite voltage to develop across the Josephson junction. In the context of dynamic storage loops as discussed, such temporary switching of a Josephson junction allows a discrete amount of magnetic flux (i.e., a single flux quantum, or "fluxon") to enter or exit a storage loop which comprises the given Josephson junction, after which the given Josephson junction becomes superconducting again.

It is to be noted that each Josephson junction depicted in the illustrative embodiments shown in the drawings comprises a Josephson tunnel junction device that is shunted with a resistor. In this regard, the term Josephson junction as used herein refers to a resistively shunted Josephson tunnel junction. The shunt resistor targets a specific value to achieve a condition referred to as critical damping (e.g., critical damping of an LC resonance of the Josephson tunnel junction between the capacitance C of the tunnel junction and the inductance L associated with a superconducting current of the tunnel junction), which directly affects the primary time constant of a Josephson junction. For example, if the resistance of the shunt resistor were reduced by 50%, the time constant would double.

More specifically, a Josephson junction is normally implemented as a parallel combination of a Josephson tunnel function with a critical current $I_C$ and a shunt resistor with resistance $R_S$, wherein the product $I_C \times R_S = V_C$ for optimal circuit operation should not exceed a specific value set by the fabrication process. For a typical process with a critical current density of 10 kA/cm2, the value $V_C$ is about 700 uV, i.e., a Josephson junction with a critical current $I_C$=100 uA would be implemented with a shunt resistor having a resistance of 7 Ohms. For ease of illustration, the shunt resistors of the Josephson junctions are not depicted in the schematic circuit diagrams of the drawings, but are assumed to be included with the Josephson junction symbols (e.g., X symbol) shown in the drawings. It is to be noted that the parameter $V_C$ sets the width of an SFQ pulse, e.g., for $V_C$=700 uV, the SFQ pulse width is about 2 picoseconds while its magnitude is about 1 mV. It is acceptable to reduce $V_C$ by using a smaller shunt resistor, which would cause a proportional reduction of the pulse height and an increase of the pulse width, since a pulse has a constant area of one flux quantum.

In an exemplary embodiment, the clockless DSFQ logic OR gate 200 operates as follows. Assume that a first (early) SFQ pulse (single fluxon) is applied to Port A. As noted above, an SFQ pulse comprises a voltage pulse having a small magnitude (e.g., 1 millivolt (mV)) and a short duration (e.g., 2 picoseconds), wherein an area of the SFQ pulse (i.e., integral of voltage over time) is equal to one magnetic flux quantum $\Phi_0$ (or one fluxon), where $\Phi_0 = h/(2e) \approx 2.07 \times 10^{-15}$ Weber (volt-seconds), where h is Planck's constant, and e denotes a magnitude of electron charge. As is known in the art, the magnetic flux quantum (o is a fundamental unit of magnetic flux which represents a quantization of magnetic flux threading a superconducting loop. In this regard, an SFQ pulse is any voltage pulse having a magnitude (in millivolts) and duration (picoseconds) such that the integral of the magnitude (voltage) over the duration (time) of the SFQ pulse is approximately $2.07 \times 10^{-15}$ weber (volt-seconds), or one magnetic flux quantum (or one fluxon).

In response to the first (early) SFQ pulse applied to Port A, a fluxon is injected into the first dynamic storage loop circuit 210-1, which generates a circulating fluxon current that flows from Port A through the first dynamic storage loop circuit 210-1 and through the output Josephson junction 220 into negative supply voltage node VSS. Since the output Josephson junction 220 is biased relatively high, the circulating fluxon current in the first dynamic storage loop circuit 210-1, combined with the relatively high static bias current $I_B$, results in a current flow through the output Josephson junction 220 which exceeds the critical current $I_{C3}$ of the output Josephson junction 220. As a result, the output Josephson junction 220 transitions temporarily to a resistive state, which causes a voltage to develop across the junction, and thus, causes an output SFQ pulse to be produced on the output node $N_{OUT}$ and output from Port Z. In particular, the switching of the output Josephson junction 220 causes the stored fluxon in the first dynamic storage loop circuit 210-1 to be released from the first dynamic storage loop circuit 210-1 and output as an SFQ pulse on Port Z (thereby decrementing the fluxon count in the first dynamic storage loop circuit 210-1 from 1 to 0).

Moreover, when the stored fluxon in the first dynamic storage loop circuit 210-1 is released and output as an SFQ pulse on Port Z (as a result of the switching of the output Josephson junction 220 to the resistive state), an "antifluxon" is backpropagated from the output node $N_{OUT}$ and injected into the second dynamic storage loop circuit 210-2 (the fluxon count in the (non-activated) second dynamic storage loop circuit 210-2 decrements, from 0 to −1). The antifluxon comprises substantially the same fluxon as the one that is released from the first dynamic storage loop circuit 210-1 to generate the output SFQ pulse, but the antifluxon generates a circulating current in the second dynamic storage loop circuit 210-2 which flows in a direction that is opposite to the direction of a circulating current that would be generated if a second (late) input SFQ pulse were applied to Port B in the same clock cycle as the first (early) input SFQ pulse applied to Port A.

In this regard, the antifluxon which is backpropagated from the output node $N_{OUT}$ and injected into the second dynamic storage loop circuit 210-2 essentially serves to annihilate a fluxon that would be subsequently injected into the second dynamic storage loop circuit 210-2 once a second (late) SFQ pulse is applied to Port B in the same clock cycle as the first (early) input SFQ pulse applied to Port A. This effectively prevents the clockless DSFQ logic OR gate 200 from entering into a metastable state (as discussed above using a confluence buffer circuit in FIG. 1) when first and second input SFQ pulses with a skew close to one pulse width are applied, in the same clock cycle, to the first and second input ports, Port A and Port B, of the clockless DSFQ logic OR gate 200. This occurs because regardless of whether the skew of the late pulse on port B vs. early pulse on port A is small (e.g., a fraction of pulse width) or large (e.g., many pulse widths), the same sequence of events takes place: an antifluxon enters a given dynamic storage loop circuit from the output port, a fluxon then enters the given dynamic storage loop circuit as a result of an SFQ pulse applied to the respective input port, and the fluxon and antifluxon annihilate each other.

On the other hand, if a second (late) SFQ pulse is not applied to Port B in the same clock cycle, the antifluxon in the second dynamic storage loop circuit 210-2 will eventually be removed by a self-resetting mechanism of the second dynamic storage loop circuit 210-2, wherein the second dynamic storage loop circuit 210-2 will self-reset to a ground state (no circulating current) after passage of a dynamic hold time without producing an output pulse. In particular, if no second (late) SFQ pulse is applied to Port B during the same clock cycle, the circulating current from the antifluxon applied over time to the dynamic switch circuit (which is comprised of the Josephson junctions 212-2 and 213-2, and the resistor 214-2) will cause that dynamic switch circuit to switch and remove (eject) the stored antifluxon, which stops the flow of circulating current and thus resets the clockless DSFQ logic OR gate 200 for the next clock cycle.

It is to be understood that the first and second dynamic storage loop circuits 210-1 and 210-2 as schematically illustrated in FIG. 2 are non-limiting exemplary embodiments of a dynamic storage loop circuit which is configured to dynamically self-reset to a ground state by ejecting the magnetic flux of a fluxon or antifluxon (which is temporarily stored in the dynamic storage loop circuit) after a period of time (e.g., dynamic hold period). In this regard, the term "dynamic storage loop circuit" as used herein broadly refers to any type of dynamic storage loop circuit of a logic gate which comprises a superconducting loop that is configured to temporarily store magnetic flux (e.g., a fluxon or antifluxon) and which comprises a leakage mechanism that allows the stored magnetic flux to leak out over time so that the logic gate self-resets to a ground state. In general, dynamic (self-resetting) storage loop circuits typically utilize either resistors or overdamped Josephson junctions that are inserted within the storage loops for flux leakage. Some dynamic storage loop circuits, particularly those using plain resistors to implement a leakage element, cause the respective dynamic logic gates to exhibit a relatively narrow input skew tolerance due to a nearly constant rate of flux leakage that is based on a single time constant of the leakage element.

As noted above, however, the exemplary dynamic storage loop circuits shown in FIG. 2 comprise a dynamic switch circuit topology which comprises a first branch (comprising a first Josephson junction) that is connected in parallel with a second branch (comprising a second Josephson junction and resistor connected in series) to provide a leakage mechanism that allows magnetic flux (e.g., fluxon or antifluxon) to escape (or otherwise be ejected from) the superconducting storage loop after a dynamic hold period. In particular, the dynamic switch circuit allows the dynamic storage loop circuit to have two independent time constants, one time constant which defines a relatively long hold period (many SFQ pulse widths) and a second time constant which defines a relatively short reset period (about one SFQ pulse width), wherein the leakage mechanism provides slow leakage during the hold period, while providing a fast relaxation to a ground state during the reset period.

For illustrative purposes, exemplary operating modes of a dynamic storage loop circuit having a circuit topology which is the same or similar to the first and second dynamic storage loop circuits 210-1 and 210-2 (as shown in FIG. 2) will now be discussed in further detail with regard to the general operation of, e.g., the first dynamic storage loop circuit 210-1 as implemented in any type of SFQ logic gate (and not just the SFQ logic OR gate of FIG. 2). Assume that an input SFQ pulse is applied to Port A, which causes a fluxon to be injected into the first dynamic storage loop circuit 210-1 resulting in a circulating loop current (fluxon current). Assume further, for purposes of illustration, that the output Josephson junction 220 does not switch in response to the circulating fluxon current in the first dynamic storage loop circuit 210-1 alone. In this case, the circulating fluxon current will temporarily flow at a nearly constant level in the first dynamic storage loop circuit 210-1 for a given period of time (dynamic hold time) defined by the first time constant (note that this would be the case, for example, if the output Josephson junction 220 was biased to only switch in response to a combination of circulating loop currents of a first and second fluxon stored in both the first and second dynamic storage loop circuits 210-1 and 210-2, respectively, thereby implementing an SFQ logic AND gate, as will be discussed in further detail below in conjunction with FIG. 5).

Initially, on a short time scale, since the resistance $R_A$ of the resistor 214-1 is very small (e.g., 1 ohm or less), the circulating fluxon current is initially distributed (e.g., evenly) between the first and second branches of the first dynamic switch circuit of the dynamic storage loop circuit 210-1. The amount of fluxon current that is injected into the first dynamic storage loop circuit 210-1 is less than the sum of the critical currents $I_{C1}$ and $I_{C2}$ of the respective first and second Josephson junctions 212-1 and 213-1, so that the initial circulating fluxon current does not cause switching of the first and second Josephson junctions 212-1 and 213-1. As noted above, assuming for purposes of illustration, that the output Josephson junction 220 does not switch in response to the circulating fluxon current in the first dynamic storage loop circuit 210-1 alone, the circulating fluxon current will temporarily flow at a nearly constant level in the first dynamic storage loop circuit 210-1 for a dynamic hold time defined by the first time constant.

During the dynamic hold time, due to the resistance $R_A$ of the resistor 214-1, the circulating fluxon current redistributes between the first and second branches of the dynamic switch circuit so that increasingly more of the circulating fluxon current flows through the first Josephson junction 212-1 (in the first branch), and increasingly less of the circulating fluxon current flows through the second Josephson junction 213-1 (in the second branch). At some point (e.g., after a certain number of $L_A/R_A$ time constants), the total current flow through the first Josephson junction 212-1 exceeds its critical current $I_{C1}$, which causes the first Josephson junction 212-1 to switch, and the switching of the first Josephson junction 212-1 causes the second Josephson junction 213-1 to switch. At this point, the finite voltage across the nodes N1 and $N_{OUT}$, which results from the switching of the first and second Josephson junctions 212-1 and 213-1, causes the removal of a stored fluxon through the Josephson junctions 212-1 and 213-1 and an associated rapid decrease in the circulating fluxon current, thus, dynamically self-resetting the internal state of the first dynamic storage loop circuit 210-1 to the ground state. This self-resetting process has a reset time that is significantly faster than the preceding hold time (for example, the hold time can be 40-50 picoseconds (or greater), as desired through tuning the circuit parameters, while the reset time would be about the time of one SFQ pulse width, e.g., a few picoseconds).

In the exemplary clockless SFQ logic OR gate 200 of FIG. 2, as noted above, the output Josephson junction 220 switches in response to the circulating fluxon current in the first dynamic storage loop circuit 210-1 to generate the output SFQ pulse on Port Z. In this case, the stored fluxon is released from the first dynamic storage loop circuit 210-1 at some point during the dynamic hold period, such that the first dynamic storage loop circuit 210-1 is placed into the ground state without having to self-reset.

It is to be noted that the first dynamic storage loop circuit 210-1 can operate in a similar fashion as discussed above when, for example, an antifluxon is injected into the first dynamic storage loop circuit 210-1 in response to the output Josephson junction 220 switching and producing an SFQ output pulse on the output node $N_{OUT}$, in response to a fluxon being injected into the second dynamic storage loop circuit 210-2 in response to a first (early) pulse applied to Port B. In this instance, as explained in further detail below in conjunction with FIGS. 4A-4C, the antifluxon will be either removed by the dynamic switch circuit of the first dynamic storage loop circuit 210-1 performing the self-reset operation as discussed above, or annihilated by a late SFQ input pulse applied to Port A.

In certain circumstances, depending on the configuration of the circuitry driving the input ports Port A and Port B of the clockless DSFQ logic OR gate 200, a stored antifluxon in the first dynamic storage loop circuit 210-1 can create a circulating current that may erroneously switch the circuitry driving Port A, or a stored antifluxon in the second dynamic storage loop circuit 210-2 can create a circulating current that may erroneously switch the circuitry driving Port B. In this regard, in other embodiments, the clockless DSFQ logic OR gate 200 may be constructed with isolation buffer circuits coupled to the input ports Port A and Port B, wherein the isolation buffer circuits are configured to absorb (without switching) the circulating currents of antifluxons which backpropagate to the input ports Port A and Port B, while being able to switch properly to inject fluxons into the first and second dynamic storage loop circuits 210-1 and 210-2 in response to SFQ pulses applied to the input ports Port A and Port B.

Figure 3A:
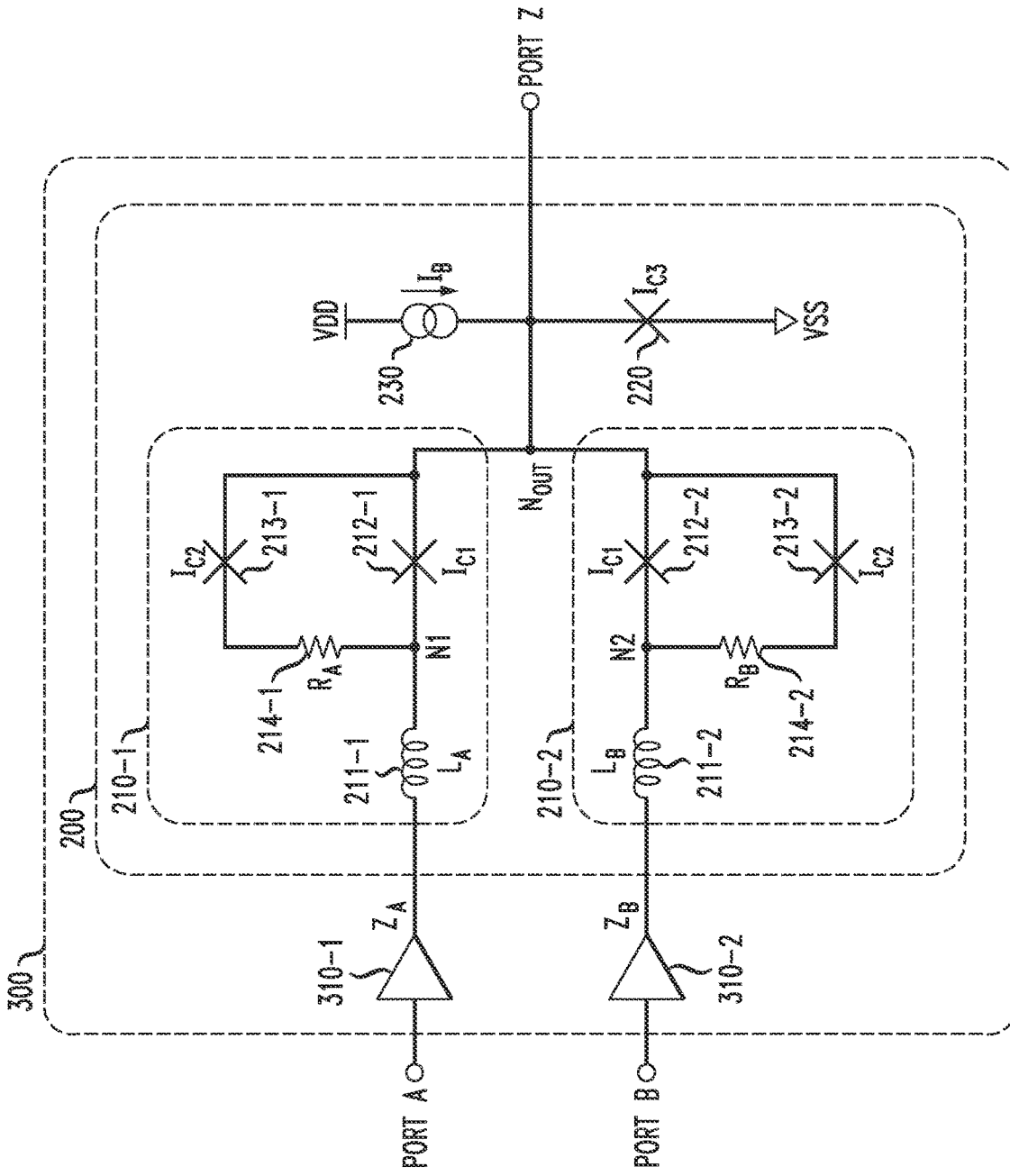
FIGS. 3A and 3B schematically illustrate a clockless SFQ logic OR gate, according to another exemplary embodiment of the disclosure.
Figure 3B:
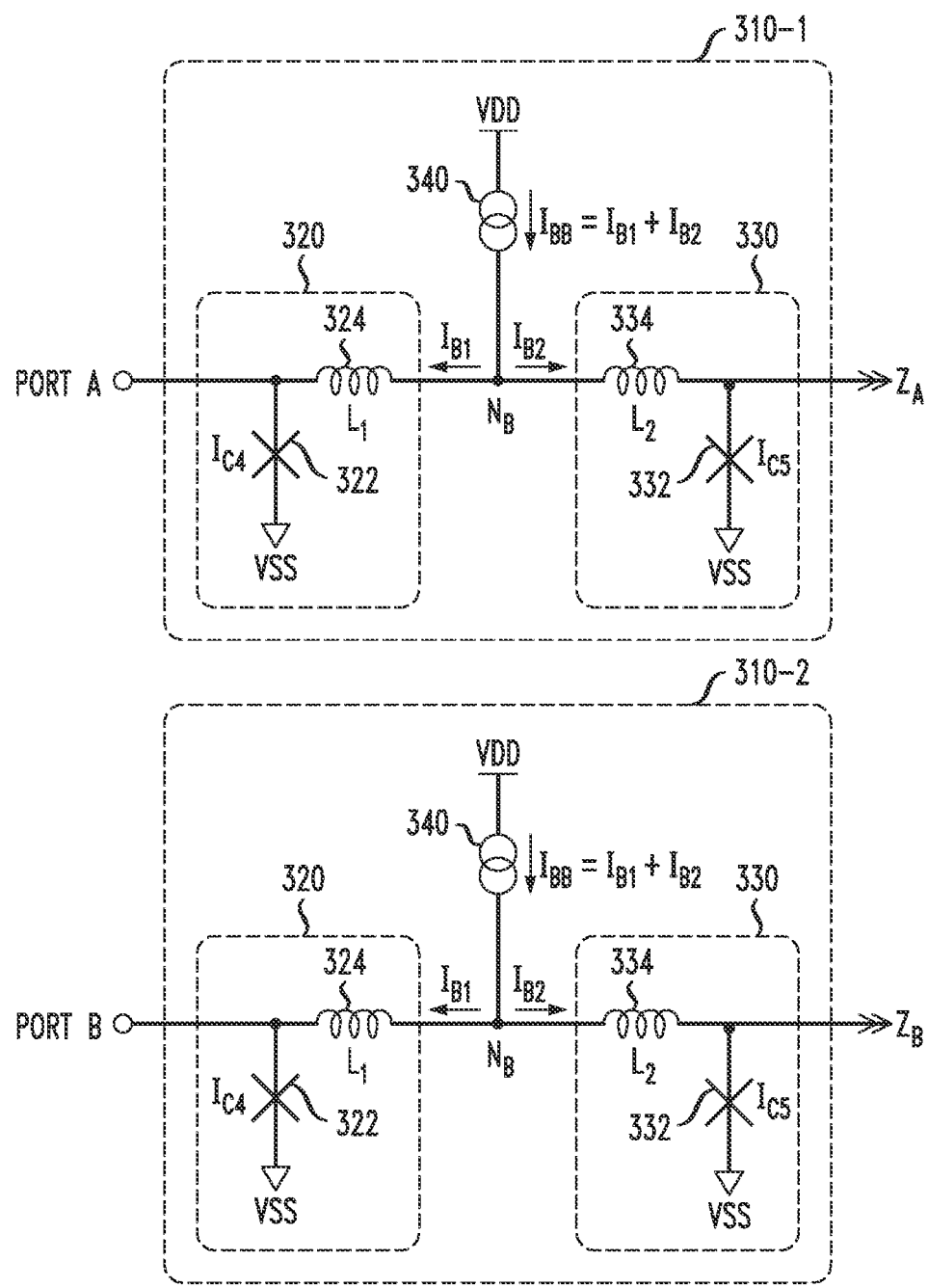

For example, FIGS. 3A and 3B schematically illustrates a clockless SFQ logic OR gate, according to another exemplary embodiment of the disclosure. In particular, FIG. 3A schematically illustrates a clockless DSFQ logic OR gate 300 which comprises the same core DSFQ logic OR gate 200 of FIG. 2, but which further comprises a first isolation buffer circuit 310-1 coupled between the input Port A and the first dynamic storage loop circuit 210-1, and a second isolation buffer circuit 310-2 coupled between Port B and the second dynamic storage loop circuit 210-2. As explained in further detail below, the first isolation buffer circuit 310-1 is configured to absorb (without switching) the circulating current of an antifluxon which is injected and temporarily stored in the first dynamic storage loop circuit 210-1, and prevent the antifluxon current from backpropagating out of Port A into upstream circuitry that drives Port A. Similarly, the second isolation buffer circuit 310-2 is configured to absorb (without switching) the circulating current of an antifluxon which is injected and temporarily stored in the second dynamic storage loop circuit 210-2, and prevent the antifluxon current from backpropagating out of Port B into upstream circuitry that drives Port B.

FIG. 3B schematically illustrates buffer circuitry which can be used to implement the first and second isolation buffer circuits 310-1 and 310-2 of FIG. 3A, according to an exemplary embodiment of the disclosure. In some embodiments, the first and second isolation buffer circuits 310-1 and 310-2 are each implemented using a Josephson transmission line (JTL) buffer circuit. Further, in some embodiments, the first and second isolation buffer circuits 310-1 and 310-2 have the same circuit architecture so that the input ports Port A and Port B of the clockless DSFQ logic OR gate 300 are driven symmetrically. In particular, the first isolation buffer circuit 310-1 and the second isolation buffer circuit 310-2 each comprise a two-stage JTL buffer circuit comprising a first stage 320 (or first JTL stage), a second stage 330 (or second JTL stage), and a DC bias circuit 340. The first stage 320 comprises a first Josephson junction 322 and a first superconducting inductor 324 (e.g., non-quantizing inductor). The second stage 330 comprises a second Josephson junction 332 and a second superconducting inductor 334

(e.g., non-quantizing inductor). The DC bias circuit 340 is coupled between a positive supply voltage node VDD and an intermediate node NB (bias current injection node) between the first and second superconducting inductors 324 and 334. The intermediate node NB is an output node of the first stage 320 and an input node of the second stage 330.

As noted above, the first isolation buffer circuit 310-1 and the second isolation buffer circuit 310-2 have the same circuit architecture, and operate in the same manner. However, in the first isolation buffer circuit 310-1, the first stage 320 comprises an input node coupled to Port A, and the second stage 330 comprises an output node $Z_A$ that is coupled to the input of the first dynamic storage loop circuit 210-1 (FIG. 3A). Furthermore, in the second isolation buffer circuit 310-2, the first stage 320 comprises an input node coupled to Port B, and the second stage 330 comprises an output node $Z_B$ that is coupled to the input of the second dynamic storage loop circuit 210-2 (FIG. 3A).

In the exemplary configuration, the first and second JTL stages 320 and 330 are both powered by the same DC bias circuit 340. In particular, the DC bias circuit 340 is configured to generate a bias current $I_{BB}$ which is injected into node NB, wherein the bias current $I_{BB}$ divides to provide a first bias current $I_{B1}$ to bias the first Josephson junction 322, and a second bias current $I_{B2}$ to bias the second Josephson junction 332. In this configuration, the first and second superconducting inductors 324 and 334 form an inductive current divider circuit which is configured to divide the bias current $I_{BB}$ into the first and second bias currents $I_{B1}$ and $I_{B2}$ according to an inductance ratio, between inductance $L_1$ of the first superconducting inductor 324 in series with a Josephson junction 322, and inductance $L_2$ of the second superconducting inductor 334 in series with Josephson junction 332.

In some embodiments, the inductance values $L_1$ and $L_2$ are chosen to provide a target inductance ratio to divide the static bias current $I_{BB}$ (which is injected into node NB) into the desired static currents $I_{B1}$ and $I_{B2}$ to bias the first Josephson junction 322 and the second Josephson junction 332, respectively. In some embodiments, where $L_1$ and $L_2$ have the same or substantially the same value, first and second bias currents $I_{B1}$ and $I_{B2}$ will be substantially the same. Further, in some embodiments, the inductance values $L_1$ and $L_2$ are chosen to be small enough so that the first and second superconducting inductors 324 and 334 are configured as non-quantizing inductors to ensure that no magnetic flux quanta can be trapped between the first and second JTL stages 320 and 330.

The first Josephson junction 322 is designed to have a critical current $I_{C4}$ and the second Josephson junction 332 is designed to have a critical current $I_{C5}$, wherein the critical current $I_{C5}$ is greater than the critical current $I_{C4}$. In some embodiments, the first Josephson junction 322 is biased at a sufficiently high level to drive the second Josephson junction 332 and allow the second Josephson junction 332 to switch and produce an SFQ pulse on the output node (e.g., $Z_A$ or $Z_B$). On the other hand, the second Josephson junction 332 is biased at a sufficiently low level to enable the second Josephson junction 332 to absorb the circulating current of an antifluxon that backpropagates and flows into the output node (e.g., $Z_A$ or $Z_B$) of the second stage 330, without increasing the current flow through the second Josephson junction 332 to a level that would exceed the critical current $I_{C5}$ and cause the second Josephson junction 332 to switch.

In some embodiments, the first Josephson junction 322 is biased at a normal level which is defined as having a ratio of the nominal bias current $I_{B1}$ to the critical current $I_{C4}$ in a range of about 0.70 to about 0.75

$$\left(\text{i.e., } 0.70 \leq \frac{I_{B1}}{I_{C4}} \leq 0.75\right),$$

whereas the second Josephson junction 332 is biased low at a level in which a ratio of the bias current $I_{B2}$ to the critical current $I_{C5}$ is in a range of about 0.20 to about 0.40

$$\left(\text{i.e., } 0.20 \leq \frac{I_{B2}}{I_{C5}} \leq 0.40\right).$$

By way of example, such substantial difference in bias conditions (by a factor of about 2×-2.5× between a normal and low relative bias level) can be achieved when the critical current $I_{C5}$ of the second Josephson junction 332 is about 1.5× greater than the critical current $I_{C4}$ of the first Josephson junction 322, while the bias current $I_{B1}$ is about 1.5× greater than the bias current $I_{B2}$. In other embodiments, such bias conditions can be achieved by optimizing the sizes (critical currents) of the first and second Josephson junctions 322 and 332 and/or adjusting the levels of the static bias currents $I_{B1}$ and $I_{B2}$ that bias the first and second Josephson junctions 322 and 332.

Figure 4A:
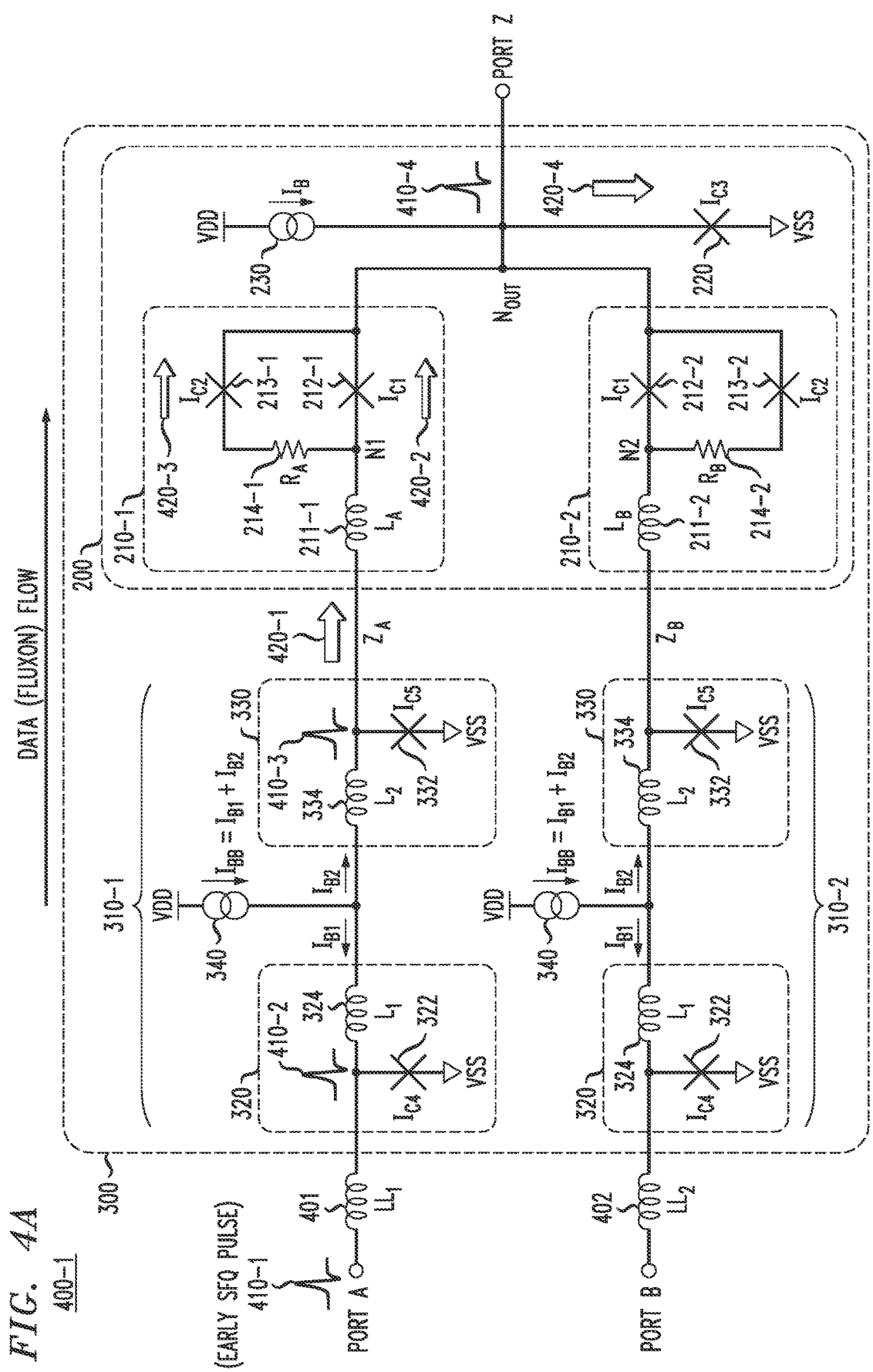
FIGS. 4A, 4B, and 4C schematically illustrate modes of operation of a clockless SFQ logic OR gate, according to an exemplary embodiment of the disclosure.
Figure 4B:
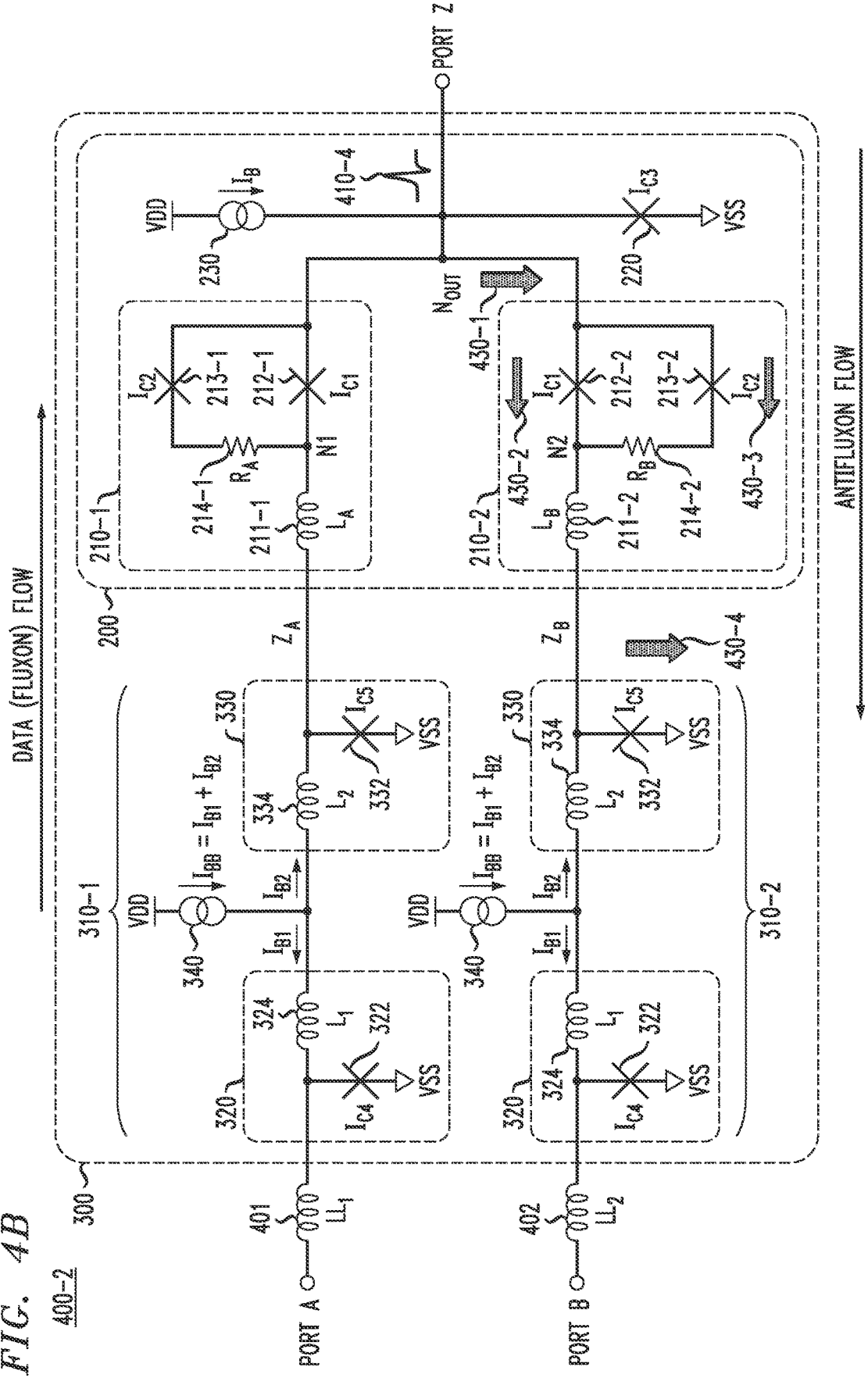
Figure 4C:
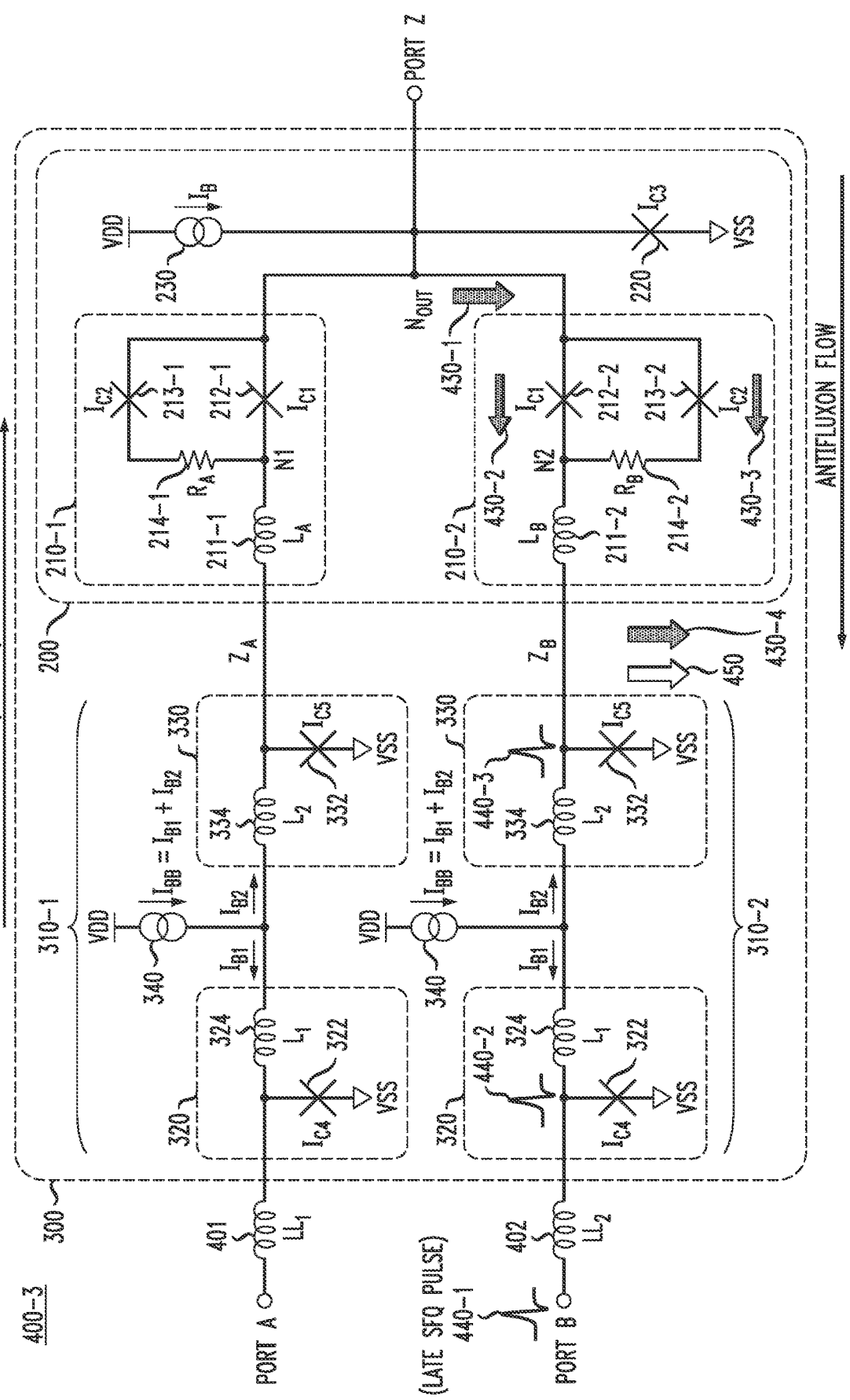

FIGS. 4A, 4B, and 4C schematically illustrate modes of operation of the clockless DSFQ logic OR gate 300, according to an exemplary embodiment of the disclosure. In particular, FIG. 4A schematically illustrates an exemplary mode of operation 400-1 in which an SFQ pulse (e.g., single fluxon) is applied to the first port, Port A, of the clockless DSFQ logic OR gate 300 in a given clock cycle. FIG. 4A depicts additional inductors 401 and 402 which represent respective input line inductances $LL_1$ and $LL_2$ of interconnect lines that connect the input ports Port A and Port B to upstream circuitry. The SFQ pulse 410-1 is applied to the input of the first JTL stage 320 of the first isolation buffer circuit 310-1. Since the various inductors 401, 324, and 334 are non-quantizing inductors, i.e., those with relatively low inductance values to prevent fluxon storage, the SFQ pulse 410-1 applied to the input of the first JTL stage 320 generates a relatively high magnitude circulating current in the first isolation buffer circuit 310-1. The SFQ pulse 410-1 applied to Port A generates a current which causes the first Josephson junction 322 to be temporarily driven above its critical current $I_{C4}$ which, in turn, causes the first Josephson junction 322 to switch and generate an SFQ pulse 410-2 that is applied to the second JTL stage 330. The SFQ pulse 410-2 generates a relatively high circulating current which causes the second Josephson junction 332 to be temporarily driven above its critical current $I_{C5}$ which, in turn, causes the second Josephson junction 332 to switch and generate an SFQ pulse 410-3 on the output node $Z_A$.

Next, the SFQ pulse 410-3 is applied to the input of the first dynamic storage loop circuit 210-1, which causes the core DSFQ logic OR gate 200 to generate an output pulse 410-4 on the output node $N_{OUT}$ which is output from Port Z. In particular, injection of the SFQ pulse 410-3 into the first dynamic storage loop circuit 210-1 causes a circulating fluxon current to flow in the first dynamic storage loop circuit 210-1. In FIG. 4A, the circulating fluxon current flow in different branches of the storage loop is represented by non-shaded arrows 420-1, 420-2, 420-3, and 420-4. The circulating fluxon current flows through the first dynamic storage loop circuit 210-1, through the output Josephson junction 220, into the negative supply voltage node VSS, and returns through the second Josephson junction 332 of the first isolation buffer circuit 310-1, back to the input of the first dynamic storage loop circuit 210-1. In this instance, the circulating loop current 420-4 through the output Josephson junction 220, combined with the bias current $I_B$, exceeds the critical current $I_{C3}$ of the output Josephson junction 220, which causes the output Josephson junction 220 to switch into a resistive state and thereby generate the output SFQ pulse 410-4 on the output node $N_{OUT}$ (which is output from Port Z). It is to be noted that FIG. 4A illustrates a desired data flow (e.g., fluxon propagation) from an input port to the output port of the clockless SFQ logic OR gate.

As noted above, the first and second superconducting inductors $L_1$ and $L_2$ of the first and second isolation buffer circuits 310-1 and 310-2 are non-quantizing such that no magnetic flux quanta can be stored between the first and second JTL stages 320 and 330. Therefore, in the exemplary embodiment of FIG. 4A, the first isolation buffer circuit 310-1 essentially operates as an SFQ pulse repeater, wherein the input SFQ pulse 410-1 is actively regenerated by the first JTL stage 320 and the second JTL stage 330 in succession after a short propagation delay. In this regard, when the input SFQ pulse 410-1 is applied to the Port A, the input SFQ pulse 410-1 causes the switching, in succession, of the first Josephson junction 322, the second Josephson junction 332, and the output Josephson junction 220, to generate the output SFQ pulse 410-4 on the output node $N_{OUT}$ resulting in the upper branch circuit (comprising the first isolation buffer circuit 310-1 and the first dynamic storage loop circuit 210-1) being reset to its ground state, i.e. having no fluxons stored in it.

Next, FIG. 4B schematically illustrates an exemplary mode of operation 400-2 of the clockless SFQ logic OR gate 300 in which the generation of the output SFQ pulse 410-4 on the output node $N_{OUT}$ causes (i) the temporarily stored fluxon to be released from the first dynamic storage loop circuit 210-1, and (ii) an antifluxon to be injected into the second dynamic storage loop circuit 210-2 from the output node $N_{OUT}$. More specifically, as schematically shown in FIG. 4B, the circulating fluxon current in the first dynamic storage loop circuit 210-1 terminates due to a stored fluxon exiting through the output port, and the first dynamic storage loop circuit 210-1 reaches its ground state. In addition, the generation of the output pulse 410-4 on the output node $N_{OUT}$ causes an antifluxon to be injected into the second (inactivated) dynamic storage loop circuit 210-2. FIG. 4B illustrates the backwards flow of an antifluxon from the output port towards an input port of the clockless SFQ logic OR gate. In this regard, the term "antifluxon" refers to a fluxon that backwards propagates from an output port towards an input port of an SFQ logic gate, which is opposite to the direction of a forward propagating fluxon from an input port to an output port of the SFQ logic gate.

In this regard, as schematically shown in FIG. 4B, the injection of the antifluxon into the second dynamic storage loop circuit 210-2 results in the flow of circulating antifluxon current flowing backwards towards Port B through the Josephson junctions 212-2 and 213-2 and the superconducting storage inductor 211-2, through the second Josephson junction 332 of the second JTL stage 330 of the second isolation buffer circuit 310-2 to the negative supply voltage node VSS (e.g., ground), and returning from the VSS node through the output Josephson junction 220. The backpropagating circulating antifluxon current flow in different branches of the storage loop is represented by shaded arrows 430-1, 430-2, 430-3, and 430-4.

As schematically illustrated in FIG. 4B, the total current flow through the second Josephson junction 332 of the second JTL stage 330 of the second isolation buffer circuit 310-2 is essentially equal to the magnitude of the static bias current $I_{B2}$ and the magnitude of the backflowing antifluxon current 430-4 which flows into the output node $Z_B$. As noted above, the second Josephson junction 332 of the second JTL stage 330 is designed to have a critical current $I_{C5}$ which is greater than the sum of the bias current $I_{B2}$ and the quantized amount of backpropagating current 430-4 (which is generated as a result of the antifluxon) so that the second Josephson junction 332 of the second JTL stage 330 can absorb the additional amount of backpropagating current 430-4 without causing the second Josephson junction 332 to switch. In this circumstance, the second Josephson junction 332 remains in a superconducting state to divert the backpropagating antifluxon current 430-4 to ground.

On the other hand, if the backpropagating antifluxon current 430-4 were sufficient to cause the second Josephson junction 332 of the second JTL stage 330 to be temporarily driven above its critical current $I_{C5}$, the second Josephson junction 332 would switch and generate a backwards propagating pulse that would be applied to the first JTL stage 320. The backward propagating pulse, in turn, would cause the first Josephson junction 322 of the first JTL stage 320 to switch and thereby generate and output a backward propagating pulse from Port B to upstream circuitry, which is undesirable. However, as noted above, the second Josephson junction 332 of the second JTL stage 330 is properly sized and biased to allow the second Josephson junction 332 to absorb (without switching) the backward flowing antifluxon current 430-4, and prevent a backward propagating pulse from being generated and propagating backward and output from Port B.

In the exemplary state shown in FIG. 4B, assume that no second (late) input SFQ pulse is applied to Port B of the clockless DSFQ logic OR gate 300 during the given clock cycle in which the first (early) input SFQ pulse were applied to Port A (as shown in FIG. 4A). In this circumstance, the stored antifluxon in the second dynamic storage loop circuit 210-2 will eventually be removed by the self-resetting mechanism of the second dynamic storage loop circuit 210-2, involving a dynamic switch circuit comprised of the Josephson junctions 212-2, 213-2 and the resistor 214-2, wherein the second dynamic storage loop circuit 210-2 will self-reset to a ground state (no circulating current) for the next clock cycle, after passage of a dynamic hold time.

In particular, when the antifluxon is injected into the second dynamic storage loop circuit 210-2 resulting in generation of the circulating antifluxon current, initially, on a short time scale, since the resistance $R_B$ of the resistor 214-2 is very small (e.g., 1 ohm or less), the circulating antifluxon current is initially distributed (e.g., evenly) between the first branch (which includes the first Josephson junction 212-2) and the second branch (which includes the series-connected second Josephson junction 213-2 and the resistor 214-2) of the second dynamic storage loop circuit 210-2. The amount of antifluxon current that is injected into the second dynamic storage loop circuit 210-2 is less than the sum of the critical currents $I_{C1}$ and $I_{C2}$ of the respective first and second Josephson junctions 212-2 and 213-2, so that the initial circulating antifluxon current does not cause switching of the first and second Josephson junctions 212-2 and 213-2. The circulating antifluxon current will temporarily flow at a nearly constant level in the second dynamic storage loop circuit 210-2 for a given period of time (dynamic hold time) defined by the first time constant.

During the hold time, due to the resistance $R_B$ of the resistor 214-2, the circulating antifluxon current redistributes between the first and second branches of the dynamic switch circuit so that increasingly more of the circulating antifluxon current flows through the first Josephson junction 212-2 (in the first branch), and increasingly less of the circulating antifluxon current flows through the second Josephson junction 213-2 (in the second branch). At some point (e.g., after a certain number of $L_B/R_B$ time constants), the total current flow through the first Josephson junction 212-2 exceeds its critical current $I_{C1}$, which causes the first Josephson junction 212-2 to switch, and the switching of the first Josephson junction 212-2 causes the second Josephson junction 213-2 to switch. At this point, the voltage polarity across the nodes N2 and $N_{OUT}$, which results from the switching of the first and second Josephson junctions 212-2 and 213-2, causes the removal of a stored fluxon through the Josephson junctions 212-2 and 213-2 and an associated rapid decrease in the circulating antifluxon current, dynamically self-resetting the internal state of the second dynamic storage loop circuit 210-2 to the ground state.

On the other hand, FIG. 4C schematically illustrates an exemplary mode of operation 400-3 in which a second (late) SFQ pulse 440-1 is applied to Port B of the clockless SFQ logic OR gate 300 during the same clock cycle in which the first (early) input SFQ pulse 410-1 was applied to Port A (as shown in FIG. 4A). For example, for illustrative purposes, it is assumed that the second (late) SFQ pulse 440-1 is applied to Port B with short delay (e.g., a few picoseconds or less) from when the first (early) SFQ pulse 410-1 is applied to Port A. In this circumstance, the second (late) SFQ pulse 440-1 causes a fluxon to be injected into the second dynamic storage loop circuit 210-2, wherein the fluxon causes annihilation of the antifluxon in the second dynamic storage loop circuit 210-2. In this case, the fluxon and antifluxon cancel each other, such that the second dynamic storage loop circuit 210-2 is placed into the ground state without having to self-reset.

In particular, as schematically illustrated in FIG. 4C, the second (late) input SFQ pulse 440-1 (which is input to Port B) is applied to the input of the first JTL stage 320 of the second isolation buffer circuit 310-2, which causes the first Josephson junction 322 to be temporarily driven above its critical current $I_{C4}$ which, in turn, causes the first Josephson junction 322 to switch and generate an SFQ pulse 440-2 that is applied to the second JTL stage 330. The SFQ pulse 440-2 generates a relatively high circulating forward propagating current (represented by unshaded arrow 450) which flows through the second Josephson junction 332. The combination of the bias current $I_{B2}$, the backward propagating antifluxon current 430-4, and the forward propagating current 450, causes the second Josephson junction 332 to be temporarily driven above its critical current $I_{C5}$ which, in turn, causes the second Josephson junction 332 to switch and generate an SFQ pulse 440-3 on the output node $Z_B$.

In this instance, the SFQ pulse 440-3 is applied to the input of the second dynamic storage loop circuit 210-2, which results in the injection of a fluxon into the second dynamic storage loop circuit 210-2 which annihilates the antifluxon stored in the second dynamic storage loop circuit 210-2. In this circumstance, the switching of the second Josephson junction 332 stops the flow of circulating current in the second dynamic storage loop circuit 210-2, which causes no further output pulse to be generated on the output node $N_{OUT}$. This restricts the logic OR gate operation to a maximum of a single output pulse per clock cycle (as desired) while simultaneously eliminating undesired metastability conditions. It is to be noted that while FIGS. 4A and 4C illustrate a first (early) input SFQ pulse applied to Port A and a second (late) input SFQ pulse applied to Port B in the same clock cycle, the operation of the clockless SFQ logic OR gate 300 is symmetrical such that similar operating modes shown in FIGS. 4A, 4B, and 4C will occur with a first (early) input SFQ pulse applied to Port B and a second (late) input SFQ pulse applied to Port A, in the same clock cycle.

In other embodiments, the first and second isolation buffer circuits 310-1 and 310-2 are configured to absorb (without switching) leakage current that flows into Port A and/or Port B from upstream logic circuitry that is coupled to the input ports Port A and Port B of the clockless DSFQ logic OR gate 300. This feature is particularly important when the respective leakage current is not constant but rather dependent on the logic state of the upstream circuitry when it cannot be eliminated by simple retuning of the bias currents. In this regard, the utilization of the first and second isolation buffer circuits 310-1 and 310-2 (e.g., two stage JTL buffer circuits) allows construction of densely coupled composite dynamic SFQ logic gates with more than two inputs, an exemplary embodiment of which will be discussed in conjunction with FIG. 5. The two-stage JTL-based isolation buffer circuits 310-1 and 310-2 as discussed above can be optimized to absorb backpropagating antifluxon currents (without switching) to prevent backpropagated pulses from being output from Port A or Port B and protect upstream logic circuitry coupled to Port A and/or Port B (i.e., backward direction isolation), as well as absorb any leakage current (without switching) which flows into Port A and/or Port B from upstream logic circuitry (i.e., forward direction isolation). The exemplary two-stage JTL-based isolation buffer circuits provide sufficient isolation in both forward and backward directions, without loss of operating margins of the circuitry, and with minimal physical space (footprint) needed for isolation buffer circuitry.

Figure 5:
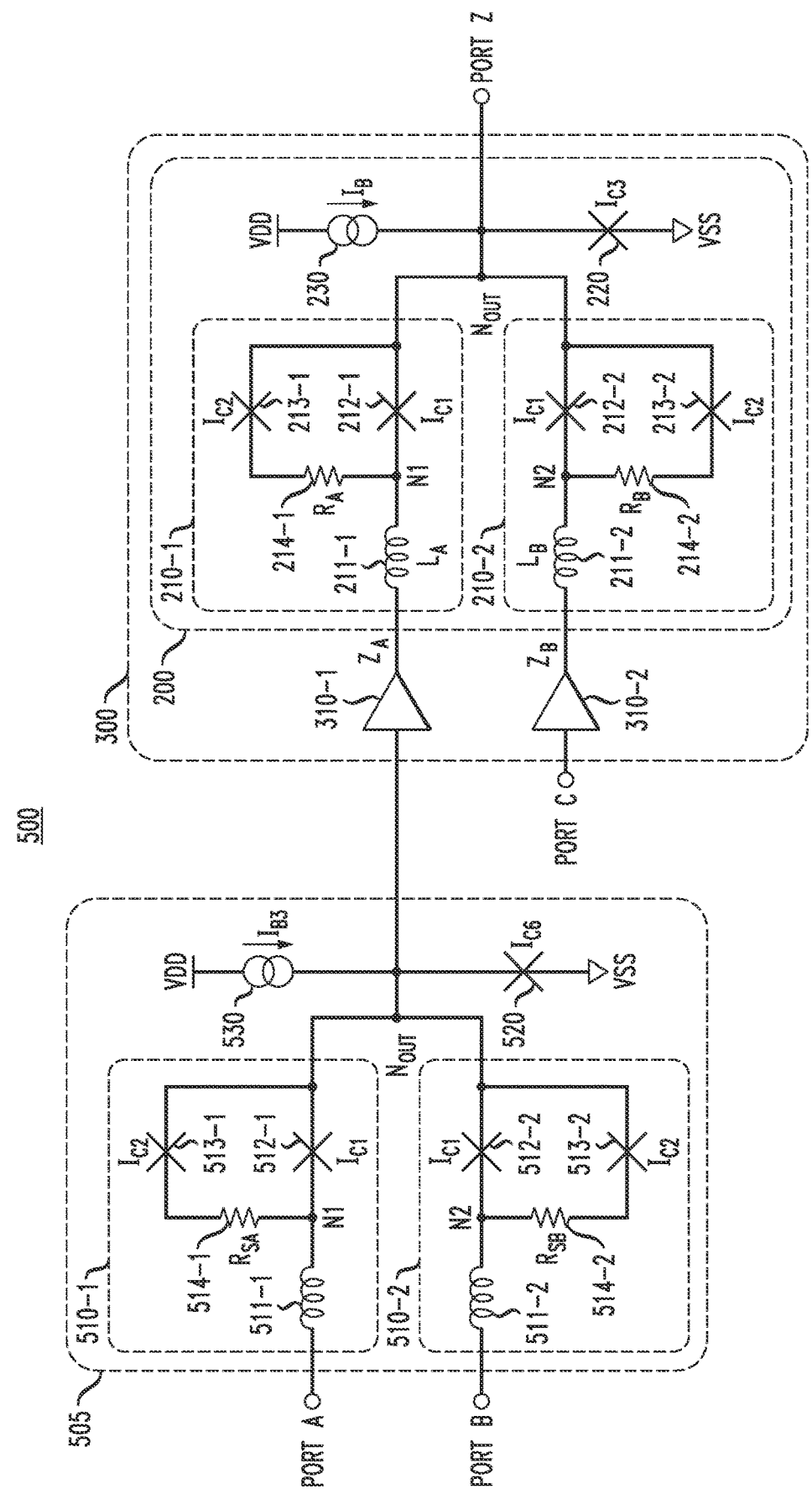
FIG. 5 schematically illustrates a combinational logic circuit comprising a clockless SFQ logic gate, according to an exemplary embodiment of the disclosure.

For example, FIG. 5 schematically illustrates a combinational logic circuit comprising clockless SFQ logic gates, according to an exemplary embodiment of the disclosure. More specifically, FIG. 5 schematically illustrates a combinational logic circuit 500 comprising a two-input clockless DSFQ logic AND gate 505 coupled to a two-input clockless DSFQ logic OR gate 300. The combinational logic circuit 500 comprises a first input port (Port A), a second input port (Port B), a third input port (Port C), and an output port (Port Z). In this regard, the combinational logic circuit 500 comprises a three-input clockless DSFQ logic AND-OR gate which is configured to perform a logic operation Z=AB+C. In the exemplary embodiment of FIG. 5, the two-input clockless DSFQ logic OR gate 300 is similar in circuit architecture and operation as the two-input DSFQ logic OR gate 300 and the core OR gate circuitry 200 as discussed above in conjunction with FIGS. 2, 3A, 3B, and 4A-4C, the details of which will not be repeated. However, as shown in FIG. 5, the first isolation buffer circuit 310-1 is coupled to an output of the clockless DSFQ logic AND gate 505, and the second isolation buffer circuit 310-2 has an input coupled to Port C.

The two-input clockless DSFQ logic AND gate 505 is similar in circuit architecture to the two-input clockless DSFQ logic OR gate 200 of FIG. 2, but is configured to implement a logic AND function. In particular, the clockless DSFQ logic AND gate 505 comprises a first dynamic storage loop circuit 510-1, a second dynamic storage loop circuit 510-2, an output Josephson junction 520, and a DC bias circuit 530. The first dynamic storage loop circuit 510-1 comprises a superconducting storage inductor 511-1 (e.g., a quantizing superconducting inductor), coupled in series with a first dynamic switch circuit, wherein the first dynamic switch circuit comprises a first Josephson junction 512-1, a second Josephson junction 513-1, and a resistor 514-1. The first Josephson junction 512-1 is connected in a first branch between a first node N1 and an output node $N_{OUT}$. The second Josephson junction 513-1 and the resistor 514-1 are serially connected in a second branch between the first node N1 and the output node $N_{OUT}$. In this configuration, the first branch is connected in parallel with the second branch to provide a nonlinear magnetic flux leakage circuit that enables the first dynamic storage loop circuit 510-1 to have two independent time constants including a first time constant corresponding to a dynamic hold time, and a second time constant corresponding to a self-resetting time.

Similarly, the second dynamic storage loop circuit 510-2 comprises a superconducting storage inductor 511-2 (e.g., a quantizing superconducting inductor), coupled in series with a second dynamic switch circuit, wherein the second dynamic switch circuit comprises a first Josephson junction 512-2, a second Josephson junction 513-2, and a resistor 514-2. The first Josephson junction 512-2 is connected in a first branch between a second node N2 and the output node $N_{OUT}$. The second Josephson junction 513-2 and the resistor 514-2 are serially connected in a second branch between the second node N2 and the output node $N_{OUT}$. In this configuration, the first branch is connected in parallel with the second branch to provide a nonlinear magnetic flux leakage circuit that enables the second dynamic storage loop circuit 510-2 to have two independent time constants including a first time constant corresponding to a dynamic hold time, and a second time constant corresponding to a self-resetting time.

In some embodiments, the first and second dynamic storage loop circuits 510-1 and 510-2 have the same (or substantially the same) circuit architecture. In particular, the superconducting storage inductor 511-1 and the superconducting storage inductor 511-2 have a same inductance (e.g., on the order of 10 picoHenries (e.g., 13 pH)). In addition, the first Josephson junctions 512-1 and 512-2 each have a critical current $I_{C1}$, and the second Josephson junctions 513-1 and 513-2 each have a critical current $I_{C2}$. In some embodiments, $I_{C1}$ and $I_{C2}$ are substantially the same. In other embodiments, $I_{C1}$ is greater than $I_{C2}$. For example, in some embodiments, $I_{C1}$ is 70 microamps (pA), and $I_{C2}$ is 50 µA. In addition, the resistor 514-1 has a resistance $R_{SA}$, and the resistor 514-2 has a resistance $R_{SB}$, wherein $R_{SA}$ and $R_{SB}$ are substantially the same. For example, in some embodiments, $R_A$ and $R_B$ are 1 Ohm, or less.

The first and second dynamic storage loop circuits 510-1 and 510-2 have outputs that are commonly connected to the output node $N_{OUT}$. The output Josephson junction 520 is coupled to and between the output node $N_{OUT}$ and a negative supply voltage node VSS. The output Josephson junction 520 is configured to have a critical current $I_{C6}$. The output Josephson junction 520 is configured to drive the input of the first isolation buffer circuit 310-1 of the clockless DSFQ logic OR gate 300. The DC bias circuit 530 is coupled between a positive power supply node VDD and the output node $N_{OUT}$. The DC bias circuit 530 is configured to generate a static bias current $I_{B3}$ to bias the output Josephson junction 520. In some embodiments, the DC bias circuit 530 comprises an RSFQ or an ERSFQ bias current source.

In some embodiments, to implement logic AND functionality, the magnitude of the bias current $I_{B3}$ is selected to bias the output Josephson junction 520 so that the output Josephson junction 520 only switches in response to a first input SFQ pulse applied to Port A and a second input SFQ pulse applied to Port B, and thereby produces an output SFQ pulse on the output node $N_{OUT}$ of the clockless DSFQ logic AND gate 505. For example, in some embodiments, the output Josephson junction 520 is biased at a level in which a ratio of the bias current $I_{B3}$ to the critical current $I_{C6}$ is in a range of about 0.30 to about 0.50

$$\left(\text{i.e., } 0.30 \le \frac{I_{B3}}{I_{C6}} \le 0.50\right).$$

For example, in an exemplary non-limiting embodiment, assuming the output Josephson junction 520 has a critical current $I_{C6}$=140 µA, the DC bias circuit 530 can be configured to generate a static bias current $I_B3$=60 µA (providing a bias level of about 42%).

In operation, when a single SFQ pulse is applied to Port A, a single fluxon is injected into the first dynamic storage loop circuit 510-1 and temporarily stored in the first dynamic storage loop circuit 510-1 for a dynamic hold time which is set by circuit parameters and targeting a value of many tens of picoseconds (i.e., about 10× more than a pulse width of the SFQ pulse), after which the fluxon is released via a dynamic loop self-reset mechanism, such as discussed above. Similarly, when a single SFQ pulse is applied to Port B, a single fluxon is injected into the second dynamic storage loop circuit 510-2 and temporarily stored in the second dynamic storage loop circuit 510-2 for a dynamic hold time which is set by circuit parameters and targeting a value of many tens of picoseconds (i.e., about 10× more than a pulse width of the SFQ pulse), after which the fluxon is released via a dynamic loop self-reset mechanism, such as discussed above. In some embodiments, where the first and second dynamic storage loop circuits 510-1 and 510-2 have the same circuit architecture, both dynamic storage loop circuits 510-1 and 510-2 will have essentially the same dynamic hold time and self-resetting time.

As schematically shown in FIG. 5, the first and second dynamic storage loop circuits 510-1 and 510-2 drive the output Josephson junction 520 which is biased with a static bias current $I_{B3}$ that is small enough, so that a circulating current of a fluxon stored in only one of the first or second dynamic storage loop circuits 510-1 and 510-2 is not sufficient (in combination with the bias current $I_{B3}$) to temporarily drive the output Josephson junction 520 above its critical current $I_{C6}$ and switch the output Josephson junction 520. As such, no SFQ pulse is generated on the output node $N_{OUT}$ of the clockless DSFQ logic AND gate 505 when an input SFQ pulse is applied to only Port A or only Port B. If only one of the first or second dynamic storage loop circuits 510-1 and 510-2 receives a fluxon, that dynamic storage loop circuit will self-reset after the passage of the dynamic hold time without producing an output SFQ pulse on the output node $N_{OUT}$ (in which case the internal state of that dynamic storage loop circuit resets to ground state). However, a fluxon dynamically stored in one of the two dynamic storage loops of the AND gate, while not causing the output Josephson junction 520 to switch, would still change the bias point of the output Josephson junction 520 and, therefore, apply a state-dependent leakage current to a logic gate driven by the output Josephson junction 520, e.g., to the input of the first isolation buffer circuit 310-1 of the clockless DSFQ logic OR gate 300.

On the other hand, when input SFQ pulses are applied on both input ports Port A and Port B with a small-to-moderate skew (i.e., within the hold time of the clockless DSFQ logic AND gate 505), a fluxon will be injected and stored in each of the first and second dynamic storage loop circuits 510-1 and 510-2. In this circumstance, the resulting circulating currents in the first and second dynamic storage loop circuits 510-1 and 510-2, together with the bias current $I_{B3}$, will be sufficient to temporarily drive the output Josephson junction 520 above its critical current $I_{C6}$ and switch the output Josephson junction 520. The switching of the output Josephson junction 520 causes (i) an SFQ pulse to be generated on the output node $N_{OUT}$ of the clockless DSFQ logic AND gate 505, and (ii) the stored fluxons will exit through the output port from the first and second dynamic storage loop circuits 510-1 and 510-2 (in which case the internal states of the first and second dynamic storage loop circuits 510-1 and 510-2 are reset to ground state). The output SFQ pulse is then applied to the input of the first isolation buffer circuit 310-1 of the clockless DSFQ logic OR gate 300.

In the combinational logic circuit configuration of FIG. 5, the first isolation buffer circuit 310-1 is configured to absorb leakage current that flows out from the output node $N_{OUT}$ of the clockless DSFQ logic AND gate 505 and is dependent on the state of that gate. For example, when a fluxon is stored in at least one of the first and second dynamic storage loop circuits 510-1 and 510-2 of the clockless DSFQ logic AND gate 505, even when the output Josephson junction 520 does not switch, some of the circulating current from the stored fluxon does leak out from the output node $N_{OUT}$ and flow into the first isolation buffer circuit 310-1 while in the absence of a stored fluxon, the leakage current is lower (this is referred to as state-dependent leakage current). However, as noted above, the first isolation buffer circuit 310-1 is configured to absorb such leakage current without switching. In particular, the first and second Josephson junctions 322 and 332 of the first and second JTL stages 320 and 330 (FIG. 3) of the first isolation buffer circuit 310-1 can be sufficiently sized and/or biased to divert such input leakage current to ground without causing either of the first and second Josephson junctions 322 and 332 to switch as a result of the additional portions of the input leakage current flowing through the first and second Josephson junctions 322 and 332 of the first and second JTL stages 320 and 330.

Figure 6:
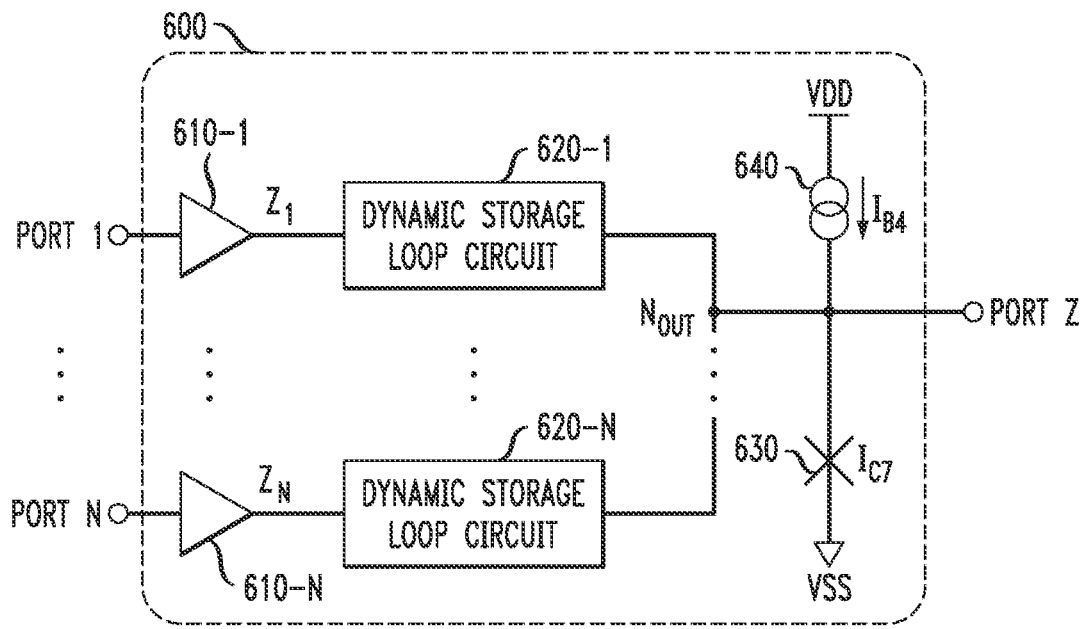
FIG. 6 schematically illustrates a clockless SFQ logic gate, according to another exemplary embodiment of the disclosure.

FIG. 6 schematically illustrates a clockless SFQ logic gate, according to another exemplary embodiment of the disclosure. In particular, FIG. 6 schematically illustrates a clockless SFQ logic gate 600 which comprises a plurality of input ports Port 1, . . . , Port N, a plurality of isolation buffer circuits 610-1, . . . , 610-N, a plurality of dynamic storage loop circuits 620-1, . . . 620-N, an output Josephson junction 630, and a DC bias circuit 640. The input ports Port 1, . . . Port N are coupled to inputs of the isolation buffer circuits 610-1, . . . , 610-N, respectively. The isolation buffer circuits 610-1, . . . , 610-N have outputs that are coupled to inputs of the dynamic storage loop circuits 620-1, . . . , 620-N, respectively. The dynamic storage loop circuits 620-1, . . . , 620-N have outputs that are commonly coupled to an output node $N_{OUT}$. The output Josephson junction 630 is coupled to and between the output node $N_{OUT}$ and a negative supply voltage node VSS. The output Josephson junction 630 is configured to have a critical current $I_{C7}$. The output Josephson junction 630 is configured to drive the output port, Port Z, which is coupled to the output node $N_{OUT}$. The DC bias circuit 640 is coupled between a positive power supply node VDD and the output node $N_{OUT}$. The DC bias circuit 640 is configured to generate a static bias current $I_{B4}$ to bias the output Josephson junction 630. For the given critical current $I_{C7}$ of the output Josephson junction 630, the static bias current $I_{B4}$ can be set based on the number of active inputs of the clockless SFQ logic gate 600, which are needed for a given logic function that is implemented by the clockless SFQ logic gate 600, to switch the output Josephson junction 630 and generate an SFQ output pulse on Port Z.

In some embodiments, the DC bias circuit 640 comprises an RSFQ or ERSFQ bias current source. In some embodiments, the isolation buffer circuits 610-1, . . . , 610-N have the same or substantially the same circuit architecture and are each implemented using a multi-stage JTL buffer circuit. For example, in some embodiments, the isolation buffer circuits 610-1, . . . , 610-N each implement a two-stage JTL buffer circuit, such as shown in FIG. 3B. In other embodiments, the isolation buffer circuits 610-1, . . . , 610-N can be implemented using 3 or more JTL stages to provide further isolation, but where the last (output) JTL stage comprises a Josephson junction that is under biased at a substantially lower percentage of its critical current to allow the Josephson junction in the last (output) JTL stage to absorb antifluxon current without switching, as discussed above, to prevent an antifluxon in a given dynamic storage loop circuit from being output from an input port.

In some embodiments, the dynamic storage loop circuits 620-1, . . . , 620-N have the same or substantially the same circuit architecture and are each implemented using a dynamic storage loop circuit topology which is the same or similar to the exemplary dynamic storage loop circuits 210-1 and 210-2 as shown and discussed above in conjunction with, e.g., FIG. 2. In some embodiments, the dynamic storage loop circuits 620-1, . . . , 620-N can each be implemented using any suitable type of dynamic storage loop circuit for a logic gate, where the dynamic storage loop circuit comprises a superconducting loop that is configured to temporarily store magnetic flux (e.g., a fluxon or an antifluxon) and which comprises a leakage mechanism that allows the stored magnetic flux to leak out over time so that the logic gate self-resets to a ground state. For example, the flux leakage mechanism of a dynamic storage loop circuit can be implemented using a single Josephson junction that is connected in parallel with a resistor.

In some embodiments, the number (N) of input ports and corresponding isolation buffer circuits and dynamic storage loops can be, e.g., N=2, 3, 5, etc., depending on the given type of logic gate. For example, in some embodiments, the clockless SFQ logic gate 600 can be a three-input SFQ logic OR gate or a three-input SFQ majority (MAJ) logic gate. For a three-input SFQ logic OR gate (N=3) with input ports Port 1, Port 2, and Port 3, an input SFQ pulse applied to one input port of three input ports would inject a fluxon in one "activated" dynamic storage loop circuit, and the output Josephson junction 630 would be biased to switch in response to the one activated input and generate an output SFQ pulse on Port Z. In addition, an antifluxon would be injected into each of the two non-activated dynamic storage loop circuits (which were in a ground state prior to the switching of the output Josephson junction 630) to annihilate a fluxon that may be later injected into one of the other two non-activated dynamic storage loop circuits due to a late SFQ input pulse applied to another one of the input ports of the three-input SFQ logic OR gate in the same clock cycle and, thereby, achieve metastability-free logic gate functionality.

For a three-input SFQ logic MAJ gate (N=3) with input ports Port 1, Port 2, and Port 3, an input SFQ pulse applied to each of at least two input ports (of the three input ports)

would inject a fluxon in each of two "activated" dynamic storage loop circuits, and the output Josephson junction 630 would be biased to switch in response to the at least two activated inputs and generate an output SFQ pulse on Port Z. In addition, an antifluxon would be injected into the one non-activated dynamic storage loop circuit (which was in a ground state prior to the switching of the output Josephson junction 630) to annihilate a fluxon that may be later injected into the one non-activated dynamic storage loop circuit due to a late SFQ input pulse applied to the corresponding input port of the three-input SFQ logic MAJ gate in the same clock cycle and, thereby, achieve metastability-free logic gate functionality.

Similarly, for a five-input SFQ logic MAJ gate (N=5) with input ports Port 1, Port 2, Port 3, Port 4, and Port 5, an input SFQ pulse applied to each of at least three input ports (of the five input ports) would inject a fluxon in each of three "activated" dynamic storage loop circuits, and the output Josephson junction 630 would be biased to switch in response to the at least three activated inputs and generate an output SFQ pulse on Port Z. In addition, an antifluxon would be injected into the two non-activated dynamic storage loop circuits (which were in a ground state prior to the switching of the output Josephson junction 630) to annihilate a fluxon that may be later injected into a given one of the non-activated dynamic storage loop circuits due to a late SFQ input pulse applied to the corresponding input port of the five-input SFQ logic MAJ gate in the same clock cycle and, thereby, achieve metastability-free logic gate functionality.

It is to be appreciated that the N-input clockless SFQ logic gate 600 of FIG. 6, which comprises N dynamic storage loop circuits 620-1, . . . , 620-N driving one output Josephson junction 630 that is biased with static DC current can operate as a metastability-free clockless SFQ logic OR gate or logic MAJ gate. For example, it is to be appreciated that for, e.g., a three-input port configuration of the clockless SFQ logic gate 600, the clockless SFQ logic gate 600 can be dynamically configured to operate as a three-input logic AND gate, a three-input logic MAJ gate, or a three-input logic OR gate, by adjusting the static bias current $I_{B4}$ (generated by the DC bias circuit 640) to adjust the bias point of the output Josephson junction 630 to switch and generate an output SFQ pulse on Port Z, in response to either 3, 2, or 1 active inputs, respectively, and not switch and produce no output SFQ pulse if the number of active inputs is 2, 1, or 0, respectively. The input isolation buffer circuits 610-1, . . . , 610-N are utilized to drive the inputs to the respective dynamic storage loop circuits 620-1, . . . , 620-N, to prevent the backpropagation of antifluxons which are injected into the non-activated dynamic storage loop circuits, and to enable metastability-free clockless gate operation for the logic OR and MAJ gate functions, using techniques as discussed above. It is to be noted that for a three-input SFQ logic AND gate, no antifluxons are generated when the logic AND gate generates an output SFQ pulse on Port Z in response to the activation of all three input ports, which makes the use of the isolation buffer circuits for a clockless SFQ logic AND gate optional.

Figure 7:
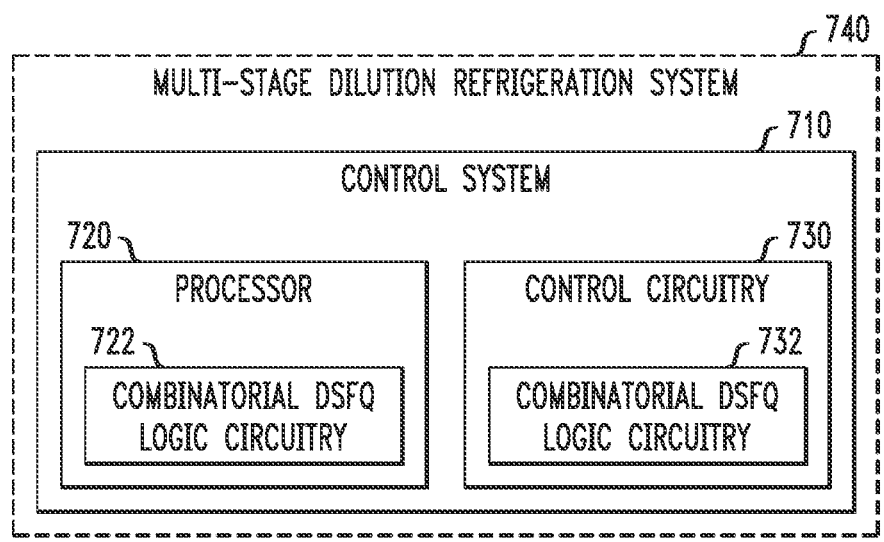
FIG. 7 schematically illustrates a superconducting computing system which implements combinational logic circuitry comprising clockless SFQ logic gates, according to an exemplary embodiment of the disclosure.

It is to be noted that the exemplary DSFQ logic circuitry as discussed herein can be utilized to construct various types of combinational logic circuits which are fundamental components for various types of VLSI integrated circuits and devices such as microprocessors for superconducting computing applications. For example, FIG. 7 schematically illustrates a superconducting computing system 700 comprising a control system 710. The control system 710 comprises at least one processor 720 which comprises combinational DSFQ logic circuitry 722, and control circuitry 730 which comprises combinational DSFQ logic circuitry 732. In some embodiments, the control system 710 is disposed in a dilution refrigeration system 740 which can generate cryogenic temperatures that are sufficient to operate components of the control system 710 for superconducting computing applications such as quantum computing applications. In some embodiments, the dilution refrigeration system 740 comprises different temperature stages such as five temperature stages: 20 millikelvin (mK), 100 mK, 1K, 3-4K, and 40K, wherein different components of the control system 710 can be cooled down to desired target temperatures, depending on the application.

In some embodiments, the processor 720 is configured to execute program code to implement one or more HPC applications where in some embodiments, the superconducting combinational DSFQ logic circuitry 722 of the processor 720 supports standard digital machine architectures and algorithms associated with standard room temperature CMOS computing. In some embodiments, the processor 720 is configured to execute computer readable program instructions that are embodied on a computer program product which includes a computer readable storage medium (or media) having such computer readable program instructions thereon for causing the processor 720 to perform various control methods using, for example, the superconducting control circuitry 730.

In some embodiments, the control system 710 is implemented for quantum computing to control the operation of an array of superconducting quantum bits (qubits) of a quantum processor. The control system 710 can be configured to (i) control a multi-channel arbitrary waveform generator (AWG) system that is configured to generate control pulses that are applied to superconducting qubits for performing single-qubit gate operations or multi-qubit bit gate operations (entanglement gate operations), (ii) control a qubit readout system to readout the quantum states of superconducting qubits, (iii) perform quantum error correction operations, etc.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 800 of FIG. 8 contains an example of an environment for the execution of at least some of the computer code involved in performing the inventive methods for high performance superconducting computing using superconducting DSFQ logic circuitry, such as high performance computing application code in block 826 which is executable by superconducting processors to implement high performance superconducting computing operations or superconducting quantum computing using superconducting DSFQ logic circuitry, as discussed herein. In addition to block 826, computing environment 800 includes, for example, computer 801, wide area network (WAN) 802, end user device (EUD) 803, remote server 804, public cloud 805, and private cloud 806. In this embodiment, computer 801 includes processor set 810 (including processing circuitry 820 and cache 821), communication fabric 811, volatile memory 812, persistent storage 813 (including operating system 822 and block 826, as identified above), peripheral device set 814 (including user interface (UI), device set 823, storage 824, and Internet of Things (IoT) sensor set 825), and network module 815. Remote server 804 includes remote database 830. Public cloud 805 includes gateway 840, cloud orchestration module 841, host physical machine set 842, virtual machine set 843, and container set 844.

Computer 801 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 830. As is well understood in the art of computer technology, and depending upon the technology, performance of a computer-implemented method may be distributed among multiple computers and/or between multiple locations. On the other hand, in this presentation of computing environment 800, detailed discussion is focused on a single computer, specifically computer 801, to keep the presentation as simple as possible. Computer 801 may be located in a cloud, even though it is not shown in a cloud in FIG. 8. On the other hand, computer 801 is not required to be in a cloud except to any extent as may be affirmatively indicated.

Processor set 810 includes one, or more, computer processors of any type now known or to be developed in the future. Processing circuitry 820 may be distributed over multiple packages, for example, multiple, coordinated integrated circuit chips. Processing circuitry 820 may implement multiple processor threads and/or multiple processor cores. Cache 821 is memory that is located in the processor chip package(s) and is typically used for data or code that should be available for rapid access by the threads or cores running on processor set 810. Cache memories are typically organized into multiple levels depending upon relative proximity to the processing circuitry. Alternatively, some, or all, of the cache for the processor set may be located "off chip." In some computing environments, processor set 810 may be designed for working with qubits and performing quantum computing.

Computer readable program instructions are typically loaded onto computer 801 to cause a series of operational steps to be performed by processor set 810 of computer 801 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 821 and the other storage media discussed below. The program instructions, and associated data, are accessed by processor set 810 to control and direct performance of the inventive methods. In computing environment 800, at least some of the instructions for performing the inventive methods may be stored in block 826 in persistent storage 813.

Communication fabric 811 is the signal conduction paths that allow the various components of computer 801 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 812 is any type of volatile memory now known or to be developed in the future. Examples include dynamic type random access memory (RAM) or static type RAM. Typically, the volatile memory is characterized by random access, but this is not required unless affirmatively indicated. In computer 801, the volatile memory 812 is located in a single package and is internal to computer 801, but, alternatively or additionally, the volatile memory may be distributed over multiple packages and/or located externally with respect to computer 801.

Persistent storage 813 is any form of non-volatile storage for computers that is now known or to be developed in the future. The non-volatility of this storage means that the stored data is maintained regardless of whether power is being supplied to computer 801 and/or directly to persistent storage 813. Persistent storage 813 may be a read only memory (ROM), but typically at least a portion of the persistent storage allows writing of data, deletion of data and re-writing of data. Some familiar forms of persistent storage include magnetic disks and solid-state storage devices. Operating system 822 may take several forms, such as various known proprietary operating systems or open source Portable Operating System Interface type operating systems that employ a kernel. The code included in block 826 typically includes at least some of the computer code involved in performing the inventive methods.

Peripheral device set 814 includes the set of peripheral devices of computer 801. Data communication connections between the peripheral devices and the other components of computer 801 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 823 may include components such as a display screen, speaker, microphone, wearable devices (such as goggles and smart watches), keyboard, mouse, printer, touchpad, game controllers, and haptic devices. Storage 824 is external storage, such as an external hard drive, or insertable storage, such as an SD card. Storage 824 may be persistent and/or volatile. In some embodiments, storage 824 may take the form of a quantum computing storage device for storing data in the form of qubits. In embodiments where computer 801 is required to have a large amount of storage (for example, where computer 801 locally stores and manages a large database) then this storage may be provided by peripheral storage devices designed for storing very large amounts of data, such as a storage area network (SAN) that is shared by multiple, geographically distributed computers. IoT sensor set 825 is made up of sensors that can be used in Internet of Things applications. For example, one sensor may be a thermometer and another sensor may be a motion detector.

Network module 815 is the collection of computer software, hardware, and firmware that allows computer 801 to communicate with other computers through WAN 802. Network module 815 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 815 are performed on the same physical hardware device. In other embodiments (for example, embodiments that utilize software-defined networking (SDN)), the control functions and the forwarding functions of network module 815 are performed on physically separate devices, such that the control functions manage several different network hardware devices. Computer readable program instructions for performing the inventive methods can typically be downloaded to computer 801 from an external computer or external storage device through a network adapter card or network interface included in network module 815.

WAN 802 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End user device (EUD) 803 is any computer system that is used and controlled by an end user (for example, a customer of an enterprise that operates computer 801), and may take any of the forms discussed above in connection with computer 801. EUD 803 typically receives helpful and useful data from the operations of computer 801. For example, in a hypothetical case where computer 801 is designed to provide a recommendation to an end user, this recommendation would typically be communicated from network module 815 of computer 801 through WAN 802 to EUD 803. In this way, EUD 803 can display, or otherwise present, the recommendation to an end user. In some embodiments, EUD 803 may be a client device, such as thin client, heavy client, mainframe computer, desktop computer and so on.

Remote server 804 is any computer system that serves at least some data and/or functionality to computer 801. Remote server 804 may be controlled and used by the same entity that operates computer 801. Remote server 804 represents the machine(s) that collect and store helpful and useful data for use by other computers, such as computer 801. For example, in a hypothetical case where computer 801 is designed and programmed to provide a recommendation based on historical data, then this historical data may be provided to computer 801 from remote database 830 of remote server 804.

Public cloud 805 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 805 is performed by the computer hardware and/or software of cloud orchestration module 841. The computing resources provided by public cloud 805 are typically implemented by virtual computing environments that run on various computers making up the computers of host physical machine set 842, which is the universe of physical computers in and/or available to public cloud 805. The virtual computing environments (VCEs) typically take the form of virtual machines from virtual machine set 843 and/or containers from container set 844. It is understood that these VCEs may be stored as images and may be transferred among and between the various physical machine hosts, either as images or after instantiation of the VCE. Cloud orchestration module 841 manages the transfer and storage of images, deploys new instantiations of VCEs and manages active instantiations of VCE deployments. Gateway 840 is the collection of computer software, hardware, and firmware that allows public cloud 805 to communicate through WAN 802.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 806 is similar to public cloud 805, except that the computing resources are only available for use by a single enterprise. While private cloud 806 is depicted as being in communication with WAN 802, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 805 and private cloud 806 are both part of a larger hybrid cloud.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
    a logic circuit comprising a clockless single flux quantum logic gate, wherein the clockless single flux quantum logic gate comprises:
    a plurality of input ports, and an output port;
    a plurality of dynamic storage loop circuits;
    an output Josephson junction coupled to an output of each of the dynamic storage loop circuits and configured to drive the output port;
    a plurality of isolation buffer circuits, wherein each isolation buffer circuit is coupled to a respective input port, and a respective dynamic storage loop circuit;
    wherein each isolation buffer circuit comprises a Josephson junction that is configured to absorb a circulating current of an antifluxon without switching, which is injected into the respective dynamic storage loop circuit as a result of the output Josephson junction switching to generate a single flux quantum output pulse on the output port, to prevent the antifluxon from being output from the respective input port; and
    wherein each isolation buffer circuit is configured to inject a fluxon into the respective dynamic storage loop circuit in response to a single flux quantum pulse applied to the respective input port, and annihilate an antifluxon that is present in the respective dynamic storage loop circuit.

2. The device of claim 1, wherein the output Josephson junction is biased at a level which enables the output Josephson junction to switch in response to a circulating current of a fluxon that is injected into at least one of the dynamic storage loop circuits to generate the single flux quantum output pulse on the output port.

3. The device of claim 1, wherein the output Josephson junction is biased at a level which enables the output Josephson junction to switch in response to circulating currents of fluxons injected in each of at least two dynamic storage loop circuits to generate the single flux quantum output pulse on the output port.

4. The device of claim 1, wherein the isolation buffer circuits have a same circuit architecture, and each of the isolation buffer circuits comprises a multi-stage Josephson transmission line buffer circuit.

5. The device of claim 4, wherein each multi-stage Josephson transmission line buffer circuit comprises a two-stage Josephson transmission line buffer circuit.

6. The device of claim 4, wherein each multi-stage Josephson transmission line buffer circuit comprises an output stage which is coupled to an input of the respective dynamic storage loop circuit, wherein the output stage comprises the Josephson junction that is configured to absorb the circulating current of the antifluxon without switching, wherein the Josephson junction is biased at a level which allows the Josephson junction of the output stage to absorb the circulating current of the antifluxon, which flows out from the input of the respective dynamic storage loop circuit, without switching the Josephson junction of the output stage as a result of a combination of a backpropagating antifluxon current and a static bias current which biases the Josephson junction of the output stage.

7. The device of claim 6, wherein the Josephson junction of the output stage is biased at a level in which a magnitude of the static bias current is in a range of about 20 percent to about 40 percent of a critical current of the Josephson junction of the output stage.

8. The device of claim 1, wherein the dynamic storage loop circuits have a same circuit architecture, wherein the dynamic storage loop circuits each comprise:
    a series combination of a superconducting inductor and a dynamic switch circuit, coupled to an input port and to the output port;
    wherein the dynamic switch circuit comprises a parallel combination of a first Josephson junction, and a series combination of a second Josephson junction and a resistor; and
    wherein the dynamic switch circuit is configured to enable dynamic self-resetting of an internal state of the dynamic storage loop circuit based on a first time constant for temporarily storing magnetic flux of a fluxon or antifluxon, and a second time constant for ejecting the stored magnetic flux.

9. The device of claim 1, wherein the clockless single flux quantum logic gate comprises a clockless logic OR gate comprising at least two input ports.

10. The device of claim 1, wherein the clockless single flux quantum logic gate comprises a clockless logic majority gate comprising at least three input ports.

11. A device, comprising:
    a logic circuit comprising a clockless single flux quantum logic gate, wherein the clockless single flux quantum logic gate comprises:
    a first input port, a second input port, and an output port;
    a first dynamic storage loop circuit;
    a second dynamic storage loop circuit;
    an output Josephson junction which is coupled to an output of the first dynamic storage loop circuit and an output of the second dynamic storage loop circuit, and which is configured to drive the output port;
    a first multi-stage Josephson transmission line buffer circuit coupled between the first input port and the first dynamic storage loop circuit, wherein the first multi-stage Josephson transmission line buffer circuit comprises an output stage which comprises a Josephson junction that is configured to absorb a circulating current of an antifluxon without switching, which is injected into the first dynamic storage loop circuit as a result of the output Josephson junction switching to generate a single flux quantum output pulse on the output port, in order to prevent the antifluxon from being output from the first input port, and configured to switch and inject a fluxon into the first dynamic storage loop circuit in response to a single flux quantum pulse applied to the first input port, and annihilate an antifluxon that is present in the first dynamic storage loop circuit; and a second multi-stage Josephson transmission line buffer circuit coupled between the second input port and the second dynamic storage loop circuit, wherein the second multi-stage Josephson transmission line buffer circuit comprises an output stage which comprises a Josephson junction that is configured to absorb a circulating current of an antifluxon without switching, which is injected into the second dynamic storage loop circuit as a result of the output Josephson junction switching to generate a single flux quantum output pulse on the output port, in order to prevent the antifluxon from being output from the second input port, and configured to switch and inject a fluxon into the second dynamic storage loop circuit in response to a single flux quantum pulse applied to the second input port, and annihilate an antifluxon that is present in the second dynamic storage loop circuit.

12. The device of claim 11, wherein the output Josephson junction is biased at a level in which a magnitude of a static bias current is at least 60 percent of a critical current of the output Josephson junction.

13. The device of claim 11, wherein the first multi-stage Josephson transmission line buffer circuit and the second multi-stage Josephson transmission line buffer circuit each comprise a two-stage Josephson transmission line buffer circuit comprising a respective input stage and the output stage.

14. The device of claim 11, wherein the Josephson junctions of the output stages of the first multi-stage Josephson transmission line buffer circuit and the second multi-stage Josephson transmission line buffer circuit are each biased with a respective static bias current having a magnitude that is in a range of about 20 percent to about 40 percent of a critical current of the Josephson junction of the output stage.

15. The device of claim 11, wherein the first dynamic storage loop circuit and the second dynamic storage loop circuit have a same circuit architecture, wherein the first dynamic storage loop circuit and the second dynamic storage loop circuit each comprise:
a first node, and a second node which is coupled to the output port;
a superconducting inductor coupled to the first node; and
a dynamic switch circuit coupled to and between the first node and the second node;
wherein the dynamic switch circuit comprises a first Josephson junction coupled between the first node and the second node, and a second Josephson junction and a resistor serially connected between the first node and the second node, in parallel with the first Josephson junction; and
wherein the dynamic switch circuit is configured to enable dynamic self-resetting of an internal state based on a first time constant for temporarily storing magnetic flux of a fluxon or antifluxon, and a second time constant for ejecting the stored magnetic flux.

16. The device of claim 11, wherein the logic circuit further comprises a second clockless single flux quantum logic gate which comprises an output port that is coupled to the first input port of the clockless single flux quantum logic gate, wherein the first multi-stage Josephson transmission line buffer circuit is configured to absorb leakage current that flows from the output port of the second clockless single flux quantum logic gate without switching the Josephson junction of the output stage of the first multi-stage Josephson transmission line buffer circuit.

17. The device of claim 11, wherein the clockless single flux quantum logic gate comprises a clockless single flux quantum OR gate.

18. A method, comprising:
receiving a first single flux quantum pulse on a first input port of a clockless single flux quantum logic gate in a given clock cycle;
injecting a fluxon into a first dynamic storage loop circuit of the clockless single flux quantum logic gate in response to the first single flux quantum pulse;
outputting a single flux quantum pulse on an output port of the clockless single flux quantum logic gate in response to the fluxon being injected into the first dynamic storage loop circuit;
injecting an antifluxon into a second dynamic storage loop circuit of the clockless single flux quantum logic gate in response to outputting the single flux quantum pulse on the output port; and
utilizing a Josephson junction of an isolation buffer circuit which is coupled to an input of the second dynamic storage loop circuit, to absorb a circulating current of the antifluxon without switching, to prevent the antifluxon from being output from a second input port of the clockless single flux quantum logic gate.

19. The method of claim 18, further comprising:
receiving a second single flux quantum pulse on the second input port of the clockless single flux quantum logic gate in the given clock cycle; and
utilizing the antifluxon in the second dynamic storage loop circuit to annihilate a fluxon that is injected into the second dynamic storage loop circuit in response to the second single flux quantum pulse so that the fluxon injected into the second dynamic storage loop circuit does not propagate to the output port.

20. The method of claim 18, wherein injecting the antifluxon into the second dynamic storage loop circuit of the clockless single flux quantum logic gate in response to outputting the single flux quantum pulse on the output port comprises switching an output Josephson junction, which is coupled to the output port, in response to a circulating current of the fluxon injected into the first dynamic storage loop circuit, to generate the single flux quantum pulse on the output port.

* * * * *